US012598809B2

(12) United States Patent
Hong et al.

(10) Patent No.: US 12,598,809 B2
(45) Date of Patent: Apr. 7, 2026

(54) DISPLAY DEVICE

(71) Applicant: Samsung Display Co., LTD., Yongin-si (KR)

(72) Inventors: Chang Yong Hong, Cheonan-si (KR); Ho Kyun Ahn, Seoul (KR); Kwang Taek Hong, Seoul (KR); In Ho Park, Asan-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 800 days.

(21) Appl. No.: 17/697,484

(22) Filed: Mar. 17, 2022

(65) Prior Publication Data

US 2022/0384490 A1 Dec. 1, 2022

(30) Foreign Application Priority Data

May 31, 2021 (KR) ........................ 10-2021-0069814

(51) Int. Cl.
*H01L 27/12* (2006.01)
*H01L 25/16* (2023.01)
(Continued)

(52) U.S. Cl.
CPC ........... *H10D 86/60* (2025.01); *H01L 25/167* (2013.01); *H10D 86/441* (2025.01); *H01L 24/24* (2013.01);
(Continued)

(58) Field of Classification Search
CPC .... H10D 86/60; H10D 86/441; H10D 86/451; H01L 25/167; H01L 24/24;
(Continued)

(56) References Cited

U.S. PATENT DOCUMENTS 10,964,771 B2 3/2021 Lee et al.
11,424,288 B2 8/2022 Chai et al.
(Continued)

FOREIGN PATENT DOCUMENTS

KR 10-2004-0093252 11/2004
KR 10-2019-0041553 4/2019
(Continued)

OTHER PUBLICATIONS

Extended European Search Report corresponding to European Application No./Patent No. 22176569.6 dated Oct. 21, 2022.
(Continued)

*Primary Examiner* — Mohammed R Alam
(74) *Attorney, Agent, or Firm* — Womble Bond Dickinson (US) LLP

(57) ABSTRACT

A display device comprises first scan line and a second scan line that extend in a first direction, a third scan line extending in a second direction intersecting the first direction, the third scan line intersecting the first scan line and the second scan line, and an insulating layer including a scan contact hole disposed between the first scan line and the third scan line, and a recess pattern disposed between the second scan line and the third scan line. The scan contact hole passes through the insulating layer in. The first scan line and the third scan line are in electrical contact with each other by the scan contact hole. The recess pattern includes a shape recessed from an upper surface to a lower surface of the insulating layer. The second scan line and the third scan line are electrically insulated from each other.

18 Claims, 21 Drawing Sheets

(51) Int. Cl.
    *H10D 86/40*        (2025.01)
    *H10D 86/60*        (2025.01)
    *H01L 23/00*        (2006.01)

(52) U.S. Cl.
    CPC .. *H01L 2224/24147* (2013.01); *H10D 86/451*
                             (2025.01)

(58) Field of Classification Search
    CPC ...... H01L 2224/24147; H01L 25/0753; H10K
                59/124; H10K 59/131; H10K 59/88;
                G09G 3/006; G09G 2310/0251; G09G
                3/3258; H10H 20/819; H10H 20/857;
                              H10H 29/142
    See application file for complete search history.

(56)           References Cited

U.S. PATENT DOCUMENTS

| | | | |
|---|---|---|---|
| 11,588,000 | B2 | 2/2023 | Choi et al. |
| 11,839,121 | B2 | 12/2023 | Lee et al. |
| 2004/0141223 | A1 | 7/2004 | Kurashina et al. |
| 2016/0125793 | A1* | 5/2016 | Kim ..................... G09G 3/3648 |
| | | | 345/213 |
| 2019/0115415 | A1* | 4/2019 | Choi ....................... G06F 3/047 |
| 2020/0258938 | A1 | 8/2020 | Chai et al. |
| 2023/0200166 | A1 | 6/2023 | Choi et al. |

FOREIGN PATENT DOCUMENTS

| | | |
|---|---|---|
| KR | 10-2020-0051108 | 5/2020 |
| KR | 10-2020-0097869 | 8/2020 |

OTHER PUBLICATIONS

Choi et al., "Flexible quantum dot light-emitting diodes for next-generation displays", NPJ Flexible Electronics, vol. 2, No. 1, Apr. 5, 2018, pp. 1-14.

* cited by examiner

VL3: VL31, VL32

T1: ACT1, G1, D1, S1

CA: CA1, CA2

RME: RME1, RME2, RME3
CNE: CNE1, CNE2, CNE3
ED: ED1, ED2

T2: ACT2, G2, D2, S2
T3: ACT3, G3, D3, S3

CA: CA1, CA2

CA: CA1, CA2

CA: CA1, CA2

DISPLAY DEVICE

CROSS-REFERENCE TO RELATED APPLICATION(S)

This application claims priority to and benefits of Korean Patent Application No. 10-2021-0069814 under 35 U.S.C. 119, filed on May 31, 2021 in the Korean Intellectual Property Office, the entire contents of which are incorporated herein by reference.

BACKGROUND

Technical Field

The disclosure relates to a display device.

Description of the Related Art

With the advancement of the information age, the demand for a display device for displaying an image has increased in various forms. For example, display devices have been applied to various electronic devices, such as a smart phone, a digital camera, a notebook computer, a navigator and a smart television.

A display device may be a device for displaying an image, and may include a display panel such as an organic light emitting display panel or a liquid crystal display panel. A display device may include a light emitting element as a light emitting display panel. For example, a light emitting diode (LED) may include an organic light emitting diode that uses an organic material as a light emitting material, and/or an inorganic light emitting diode that uses an inorganic material as a light emitting material.

A gate line for transferring a scan signal to a light emitting diode may include a vertical gate line and a horizontal gate line, which may intersect each other.

SUMMARY

An aspect of the disclosure is to provide a display device that may suppress or avoid an inspection error caused by aperiodicity of a contact hole.

Aspects of the disclosure are not limited to those mentioned above and additional aspects of the disclosure, which are not mentioned herein, will be clearly understood by those skilled in the art from the following disclosure.

According to an embodiment of the disclosure, a display device may include a first scan line extending in a first direction, a second scan line separated from the first scan line and extending in the first direction, a third scan line extending in a second direction intersecting the first direction, the third scan line intersecting the first scan line and the second scan line, and an insulating layer including a scan contact hole disposed between the first scan line and the third scan line, and a recess pattern disposed between the second scan line and the third scan line. The scan contact hole may pass through the insulating layer in a thickness direction, the first scan line and the third scan line may be in electrical contact with each other by the scan contact hole. The recess pattern may include a shape recessed from an upper surface to a lower surface of the insulating layer in the thickness direction. The second scan line and the third scan line may be electrically insulated from each other.

The display device may further include an etch stop pattern overlapping the second scan line and the third scan line in the thickness direction. The insulating layer may include a buffer layer, and an interlayer insulating layer, the buffer layer and the interlayer insulating layer being sequentially deposited. The etch stop pattern may be disposed between the buffer layer and the interlayer insulating layer.

The recess pattern may expose the etch stop pattern, and the third scan line may extend to the etch stop pattern.

The etch stop pattern may include an isolated shape.

The etch stop pattern may include an oxide semiconductor.

The third scan line may be disposed in the recess pattern, and the insulating layer may be at least partially disposed between the third scan line disposed in the recess pattern and the second scan line in the thickness direction.

The display device may further include a display area for displaying an image. The scan contact hole and the recess pattern may be disposed in the display area.

The display device may further include a via layer disposed on the third scan line, a first electrode disposed on the via layer, a second electrode disposed on the via layer and separated from the first electrode, and a light emitting element disposed on the first electrode and the second electrode.

The light emitting element may include an inorganic material.

According to an embodiment of the disclosure, a display device may include a first conductive layer disposed on a substrate, the first conductive layer including a first scan line and a second scan line, a buffer layer disposed on the first conductive layer, a semiconductor layer disposed on the buffer layer, the semiconductor layer including an active layer of a thin film transistor, a gate insulating layer disposed on the semiconductor layer, a gate electrode of the thin film transistor, which may be disposed on the gate insulating layer, an interlayer insulating layer disposed on the gate electrode, a third scan line disposed on the interlayer insulating layer, the third scan line overlapping the first scan line and the second scan line, a scan contact hole disposed in a first overlap area where the first scan line and the third scan line overlap each other, the scan contact hole passing through the buffer layer, the gate insulating layer and the interlayer insulating layer in a thickness direction, and a recess pattern disposed in a second overlap area where the second scan line and the third scan line overlap each other, the recess pattern defined by at least one of the buffer layer, the gate insulating layer and the interlayer insulating layer, and including a shape recessed from an upper surface to a lower surface of the interlayer insulating layer.

The display device may further include an etch stop pattern disposed between the buffer layer and the gate insulating layer, the etch stop pattern overlapping the second scan line and the third scan line.

The etch stop pattern and the active layer may include a same material.

The etch stop pattern may be separated from the active layer, and may include an isolated shape.

The recess pattern may expose the etch stop pattern, and the third scan line extends to the etch stop pattern.

The first scan line and the second scan line may extend in a first direction, and the third scan line may extend in a second direction intersecting the first direction.

The display device may further include a via layer disposed on the third scan line, a first electrode disposed on the via layer, a second electrode disposed on the via layer and separated from the first electrode, and a light emitting element disposed on the first electrode and the second electrode.

The light emitting element may include an inorganic material.

According to an embodiment of the disclosure, a display device may include a plurality of first scan lines extending in a first direction, a second scan line extending in a second direction intersecting the first direction and overlapping the plurality of first scan lines, first overlap areas where a subset of the plurality of first scan lines overlap the second scan line, the subset of the plurality of first scan lines being electrically connected with the second scan line in the first overlap areas, second overlap areas where another subset of the plurality of first scan lines overlap the second scan line, the another subset of the plurality of first scan lines being electrically insulated from the second scan line in the second overlap areas, and an insulating layer disposed between the plurality of first scan lines and the second scan line, defining recess patterns having a shape recessed from an upper surface to a lower surface in the second overlap areas.

The display device may further include scan contact holes disposed in the first overlap areas, the scan contact holes passing through the insulating layer in a thickness direction. At least one of the first scan lines and the second scan line may be in electrical contact with each other in the first overlap areas through the scan contact holes.

A number of the recess patterns may be greater than a number of the scan contact holes.

In the display device according to an embodiment, an inspection error caused by aperiodicity of a contact hole may be suppressed or avoided.

Effects according to embodiments of the disclosure are not limited to those mentioned above and more various effects are included in the following description of the disclosure.

BRIEF DESCRIPTION OF THE DRAWINGS

The above and other aspects and features of the disclosure will become more apparent by describing in detail embodiments thereof with reference to the attached drawings, in which.

DETAILED DESCRIPTION OF THE EMBODIMENTS

Hereinafter, detailed embodiments of the disclosure will be described with reference to the accompanying drawings.

As used herein, the singular forms, "a," "an," and "the" are intended to include the plural forms as well (and vice versa), unless the context clearly indicates otherwise.

The term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or."

In the specification and the claims, the phrase "at least one of" is intended to include the meaning of "at least one selected from the group of" for the purpose of its meaning and interpretation. For example, "at least one of A and B" may be understood to mean "A, B, or A and B."

The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art.

When an element is described as "not overlapping" or "to not overlap" another element, this may include that the elements are spaced apart from each other, offset from each other, or set aside from each other or any other suitable term as would be appreciated and understood by those of ordinary skill in the art.

Unless otherwise defined, all terms (including technical and scientific terms) used herein have the same meaning as commonly understood by one of ordinary skill in the art to which the disclosure pertains. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 1:
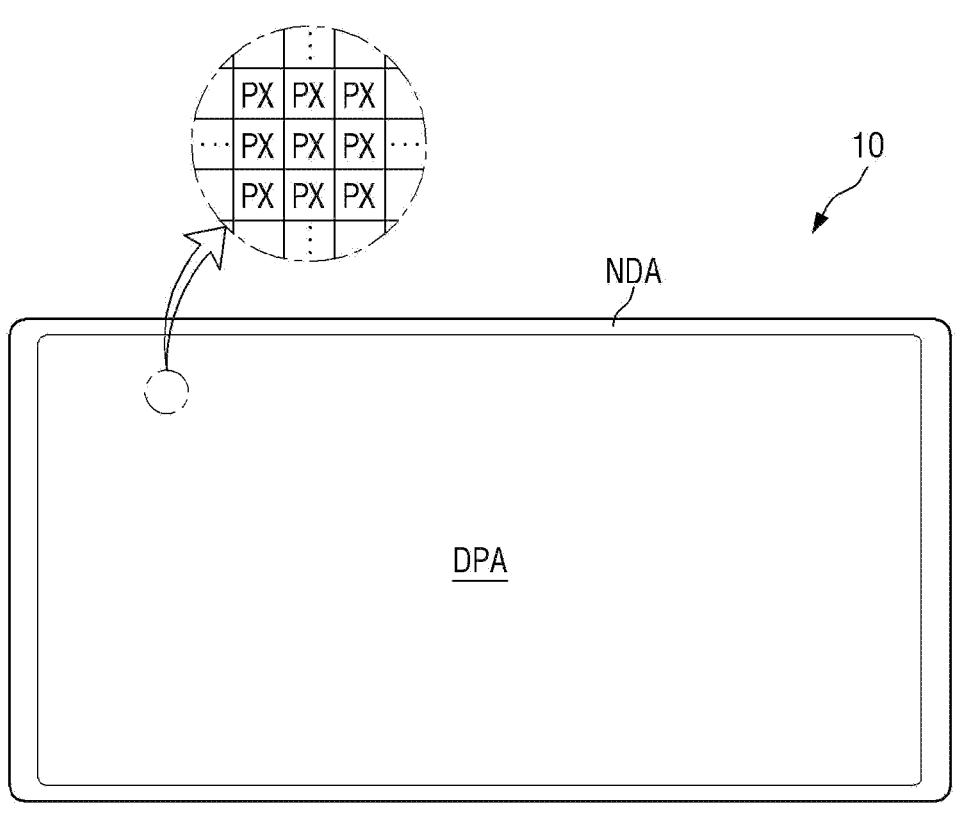
FIG. 1 is a schematic plan view illustrating a display device according to an embodiment of the disclosure.
Figure 1:
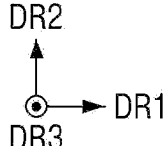

FIG. 1 is a schematic plan view illustrating a display device according to an embodiment of the disclosure.

In the drawing, a first direction DR1 may refer to a horizontal direction of a display device 10 in a plan view, and a second direction DR2 may refer to a vertical direction of the display device 10 in plan view. A third direction DR3 may refer to a thickness direction of the display device 10. The first direction DR1 and the second direction DR2 may intersect each other in a vertical direction, and the third direction DR3 may be a direction intersecting the plane on which the first direction DR1 and the second direction DR2 may be arranged (or disposed), and intersects both the first direction DR1 and the second direction DR2 in a vertical direction. However, it is to be understood that the direction mentioned in describing an embodiment may refer to a relative direction, and embodiments are not limited to the direction mentioned herein.

Unless otherwise defined, in this specification, a side of the first direction DR1 may refer to a right direction in a plan view, and another side of the first direction DR1 may refer to a left direction in plan view. A side of the second direction DR2 may refer to an upper direction in plan view, and another side of the second direction DR2 may refer to a lower direction in plan view. Also, "upper portion" or "upper surface" expressed based on the third direction DR3 may refer to a side of a display surface based on a display panel, and "lower portion" or "lower surface" expressed based on the third direction DR3 may refer to an opposite side of the display surface based on the display panel.

Referring to FIG. 1, the display device 10 may display a moving image or a still image. The display device 10 may refer to any electronic device that provides a display screen. For example, a television, a notebook computer, a monitor, an advertising board, an Internet of Things device, a mobile phone, a smart phone, a tablet personal computer (PC), an electronic watch, a smart watch, a watch phone, a head mounted display, a mobile communication terminal, an electronic diary, an electronic book, a portable multimedia player (PMP), a navigator, a game machine, a digital camera, a camcorder and the like may be the display device 10.

The display device 10 may include a display panel for providing a display screen. Examples of the display panel include an inorganic light emitting diode display panel, an organic light emitting display panel, a quantum dot light emitting display panel, a plasma display panel, and a field emission display panel. Hereinafter, an inorganic light emitting diode display panel is discussed as an example of a display panel, but embodiments are not limited thereto. Other display panels may be used in other embodiments.

Various modifications may be made in a shape of the display device 10. For example, the display device 10 may have a rectangular shape that may be long in a horizontal direction, a rectangular shape that may be long in a vertical direction, a square shape, a square shape with rounded corners (vertices), other polygonal shape, a circular shape, etc. A shape of a display area DPA of the display device 10 may also be similar to the overall shape of the display device 10. In FIG. 1, a rectangular display device 10 that may be long in the first direction DR1 is illustrated in FIG. 1.

The display device 10 may include a display area DPA and a non-display area NDA. The display area DPA may be an area in which a screen may be displayed, and the non-display area NDA may be an area in which a screen may not be displayed. The display area DPA may be referred to as an active area, and the non-display area NDA may be referred to as an inactive area. The display area DPA may generally occupy the center of the display device 10.

The display area DPA may include pixels PX. The pixels PX may be arranged in a matrix direction. A shape of each pixel PX may be a rectangular or square shape in plan view, but is not limited thereto. The shape of each pixel PX may be a rhombus shape in which each side may be inclined with respect to a direction. Each pixel PX may be arranged in a stripe type or a PENTILE™ type. Each of the pixels PX may include one or more light emitting elements for emitting light of a specific wavelength band to display a specific color.

The non-display area NDA may be disposed in the vicinity of the display area DPA. The non-display area NDA may fully or partially surround the display area DPA. The display area DPA may be rectangular in shape, and the non-display area NDA may be disposed to be adjacent to four sides of the display area DPA. The non-display area NDA may constitute a bezel of the display device 10. Lines or circuit drivers included in the display device 10 may be disposed in the non-display areas NDA, or external devices may be packaged therein.

Figure 2:
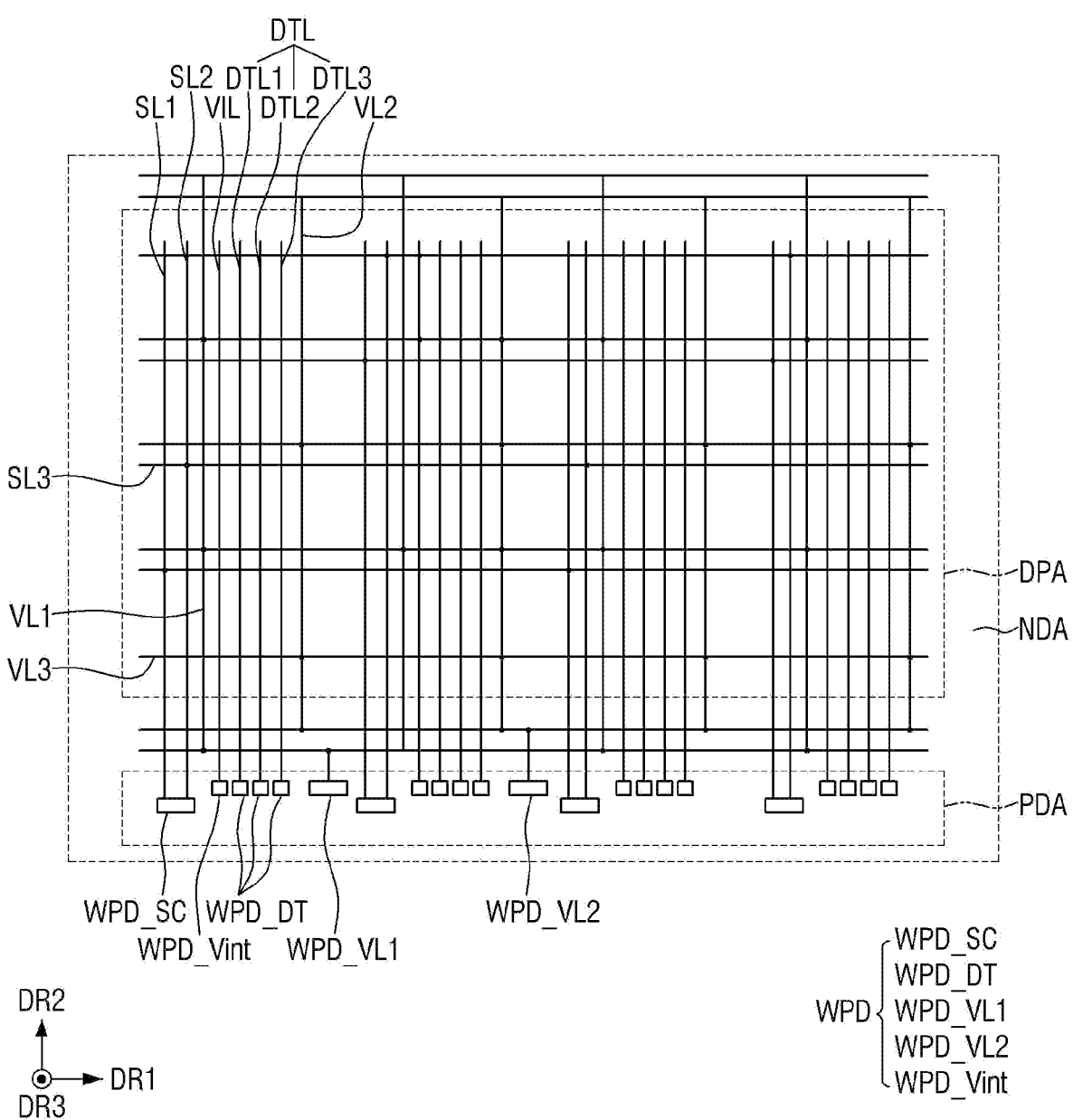
FIG. 2 is a schematic plan view illustrating lines of a display device according to an embodiment of the disclosure.

FIG. 2 is a schematic plan view illustrating lines of a display device according to an embodiment of the disclosure.

Referring to FIG. 2, the display device 10 may include lines. The lines may include scan lines SL; SL1, SL2 and SL3, data lines DTL; DTL1, DTL2 and DTL3, an initialization voltage line VIL and voltage lines VL; VL1, VL2, VL3 and VL4. Although not shown, the display device 10 may further include other lines. The lines may include lines made of a first conductive layer and extended in the second direction DR2, and lines made of a third conductive layer and extended in the first direction DR1.

The first scan line SL1 and the second scan line SL2 may be disposed to be extended in the second direction DR2. The first scan line SL1 and the second scan line SL2 may be disposed to be adjacent to each other, and may be spaced apart from another first scan line SL1 and another second scan line SL2 in the first direction DR1. The first scan line SL1 and the second scan line SL2 may be connected with a scan line pad WPD_SC connected to a scan driver (not shown). The first scan line SL1 and the second scan line SL2 may be disposed to be extended from a pad area PDA disposed in the non-display area NDA to the display area DPA.

The third scan line SL3 may be disposed to be extended in the first direction DR1, and may be spaced apart from another third scan line SL3 in the second direction DR2. The third scan line SL3 may be connected with one or more first scan lines SL1 or one or more second scan lines SL2. The scan lines SL may have a mesh structure on a front surface of the display area DPA, but are not limited thereto.

The third scan line SL3 may be connected with at least one of the first scan line SL1 and the second scan line SL2 by a contact hole, wherein the contact hole may be disposed in the display area DPA. In other words, the third scan line SL3 may be in contact with at least one of the first scan line SL1 and the second scan line SL2 within the display area DPA.

A third scan line SL3 may be connected with at least one of multiple first scan lines SL1 and at least one of multiple second scan lines SL2. In case that the third scan lines SL3 are insulated from each other in an area that overlaps and intersects the first scan line SL1 and the second scan line SL2, a recess pattern DMG (see FIG. 4) may be disposed in the corresponding intersecting area. The recess pattern DMG (see FIG. 4) may suppress or prevent defects that may be detected during an auto optical inspection (AOI).

The meaning of "connection" herein may mean that a member may be connected with another member through an intermediate member as well as through a mutual direct contact. Further, it can be understood that a portion and another portion may be interconnected by means of an integrated member. Furthermore, the connection of any member with another member may be interpreted as an electrical connection and/or a physical connection.

The data line DTL may be disposed to be extended in the second direction DR2. The data line DTL includes a first data line DTL1, a second data line DTL2 and a third data line DTL3, and the first to third data lines DTL1, DTL2 and DTL3 may be disposed to be adjacent to one another in one pair. Each of the data lines DTL1, DTL2 and DTL3 may be disposed to be extended from the pad area PDA disposed in the non-display area NDA to the display area DPA.

The initialization voltage line VIL may be disposed to be extended in the second direction DR2. The initialization voltage line VIL may be disposed between the data lines DTL and the second scan line SL2. The initialization voltage line VIL may be disposed to be extended from the pad area PDA disposed in the non-display area NDA to the display area DPA.

The first voltage line VL1 and the second voltage line VL2 may be disposed to be extended in the second direction DR2, and the third voltage line VL3 may be disposed to be extended in the first direction DR1 intersecting the second direction DR2. As described below, the first voltage line VL1 and the second voltage line VL2 may be made of a first conductive layer, and the third voltage line VL3 may be made of a third conductive layer disposed on a layer different from the first conductive layer. The first voltage line VL1 and the second voltage line VL2 may be extended in the second direction DR2 across the display area DPA, and some lines of the third voltage line VL3 may be disposed in the display area DPA, and the other lines thereof may be disposed in the non-display area NDA positioned at both sides in the second direction DR2 of the display area DPA. The first voltage line VL1 and the second voltage line VL2 may be connected with at least one third voltage line VL3, and may be connected with different third voltage lines VL3. The voltage lines VL may have a mesh structure on a front surface of the display area DPA.

The first scan line SL1, the second scan line SL2, the data line DTL, the initialization voltage line VIL, the first voltage line VL1 and the second voltage line VL2 may electrically be connected with at least one line pad WPD. Each line pad WPD may be disposed in the non-display area NDA. In an embodiment, each line pad WPD may be disposed in the pad area PDA positioned at a lower side corresponding to the another side of the second direction DR2 of the display area DPA. The first scan line SL1 and the second scan line SL2 may be connected with a scan line pad WPD_SC disposed in the pad area PDA, and the data lines DTL may be connected with different data line pads WPD_DT, respectively. The initialization voltage line VIL may be connected to an initialization line pad WPD_Vint, the first voltage line VL1 may be connected with a first voltage line pad WPD_VL1, and the second voltage line VL2 may be connected with a second voltage line pad WPD_VL2. An external device may be packaged on the line pad WPD. The external device may be packaged on the line pad WPD via an anisotropic conductive film, an ultrasonic bonding or the like. In the drawing, each line pad WPD may be disposed in the pad area PDA disposed below the display area DPA, but embodiments are not limited thereto. Some of the line pads WPD may be disposed on an upper side, the left, or the right sides of the display area DPA.

Each pixel PX or subpixel SPXn (n may be an integer of 1 to 3) of the display device 10 may include a pixel driving circuit. The above-described lines may apply a driving signal to each pixel driving circuit while passing through each pixel PX or the periphery of each pixel PX. The pixel driving circuit may include a transistor and a capacitor. Various modifications may be made in the number of transistors and capacitors of each pixel driving circuit. According to an embodiment, each subpixel SPXn of the display device 10 may have a 3T1C structure in which the pixel driving circuit may include three transistors and one capacitor. Hereinafter, the pixel driving circuit will be described based on the 3T1C structure, but embodiments are not limited thereto, and various modifications such as 2T1C structure, 7T1C structure and 6T1C structure may be made in the subpixel SPXn.

Figure 3:
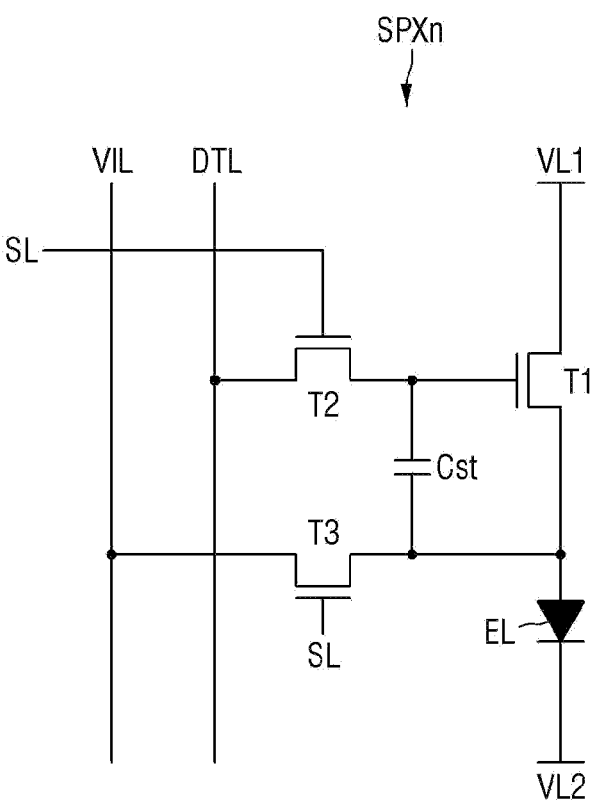
FIG. 3 is a schematic circuit view illustrating a subpixel according to an embodiment of the disclosure.

FIG. 3 is a schematic circuit view illustrating a subpixel according to an embodiment of the disclosure.

Referring to FIG. 3, each pixel PX (see FIG. 1) of the display device 10 according to an embodiment may include multiple subpixels SPXn. Hereinafter, the description will be based on that the number of the subpixels SPXn of each pixel PX (see FIG. 1) is 3, but embodiments are not limited thereto. Each subpixel SPXn may include three transistors T1, T2 and T3 and one storage capacitor Cst in addition to a light emitting diode EL.

The light emitting diode EL may emit light in accordance with a current supplied through the first transistor T1. The light emitting diode EL may include a first electrode, a second electrode, and at least one light emitting element disposed between the first electrode and the second electrode. The light emitting element may emit light of a specific wavelength band by an electrical signal transferred from the first electrode and the second electrode.

An end of the light emitting diode EL may be connected to a source electrode of the first transistor T1, and another end thereof may be connected to the second voltage line VL2 supplied with a low potential voltage (hereinafter, second power voltage) lower than a high potential voltage (hereinafter, first power voltage) of the first voltage line VL1. Further, the other end of the light emitting diode EL may be connected to a source electrode of the second transistor T2.

The first transistor T1 may adjust a current flowing from the first voltage line VL1, to which the first power voltage may be supplied, to the light emitting diode EL in accordance with a voltage difference between the gate electrode and the source electrode. For example, the first transistor T1 may be a driving transistor for driving the light emitting diode EL. The gate electrode of the first transistor T1 may be connected to the source electrode of the second transistor T2, the source electrode thereof may be connected to the first electrode of the light emitting diode EL, and the drain electrode thereof may be connected to the first voltage line VL1 to which the first power voltage may be applied.

The second transistor T2 may be turned on by the scan signal of the scan line SL to connect the data line DTL to the gate electrode of the first transistor T1. The gate electrode of the second transistor T2 may be connected to the scan line SL, the source electrode thereof may be connected to the gate electrode of the first transistor T1, and the drain electrode thereof may be connected to the data line DTL.

The third transistor T3 may be turned on by the scan signal of the scan line SL to connect the initialization voltage line VIL to an end of the light emitting diode EL. The gate electrode of the third transistor T3 may be connected to the scan line SL, the drain electrode thereof may be connected to the initialization voltage line VIL, and the source electrode thereof may be connected to an end of the light emitting diode EL or the source electrode of the first transistor T1. The second transistor T2 and the third transistor T3 may simultaneously be turned on by the same scan signal.

In an embodiment, the source and drain electrodes of each of the transistors T1, T2 and T3 are not limited to those described above, and may be opposite cases of those described above. Each of the transistors T1, T2 and T3 may be formed of a thin film transistor. In FIG. 3, each of the transistors T1, T2 and T3 may be formed of N-type metal oxide semiconductor field effect transistor (MOSFET), but is not limited thereto. For example, each of the transistors T1, T2 and T3 may be formed of P-type MOSFET, or a portion of the transistors T1, T2 and T3 may be N-type MOSFET and another portion may be formed of P-type MOSFET.

The storage capacitor Cst may be formed between the gate electrode and the source electrode of the first transistor T1. The storage capacitor Cst may store a differential voltage of the gate voltage and the source voltage of the first transistor T1.

Figure 4:
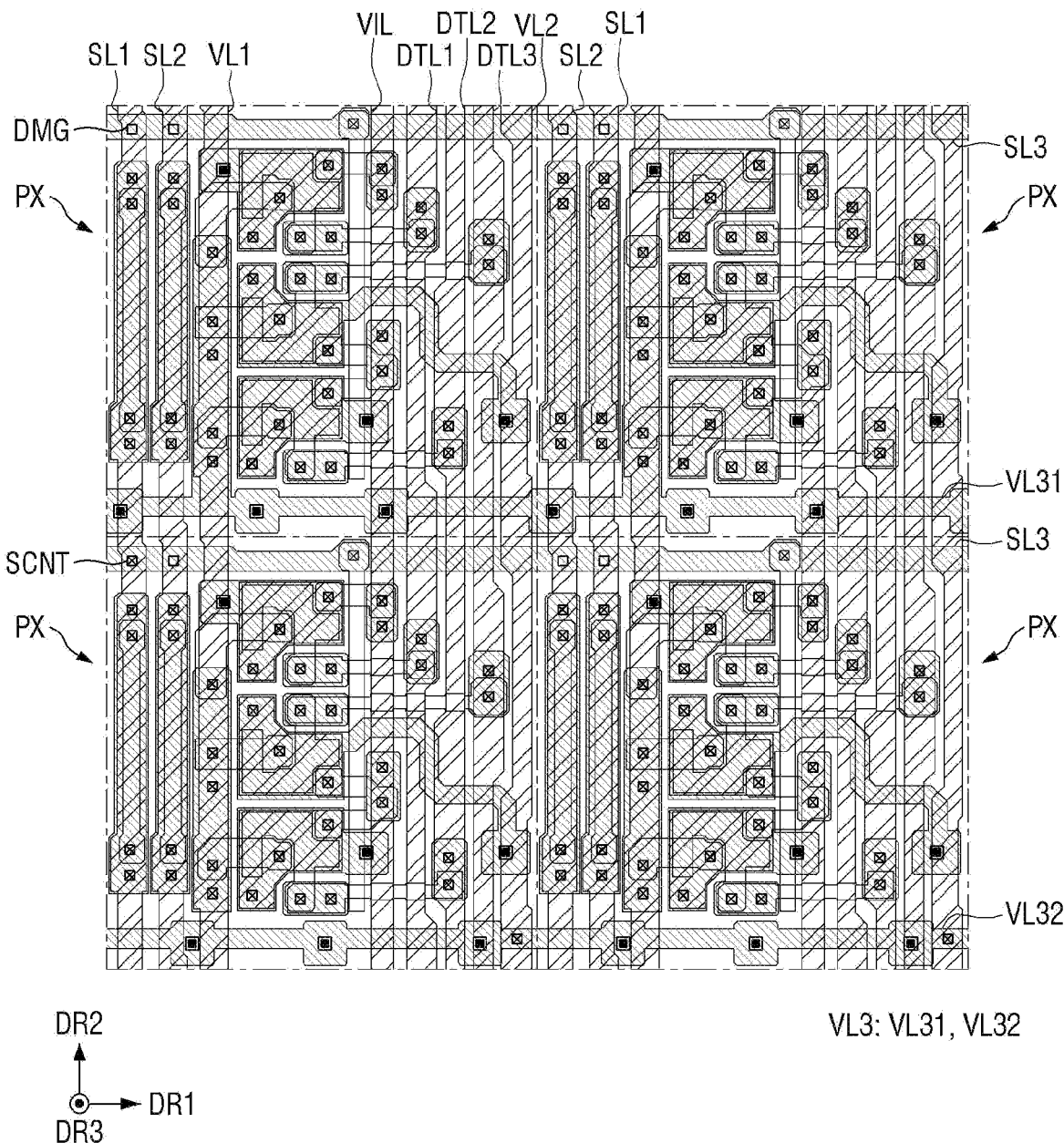
FIG. 4 is a schematic plan view illustrating pixels of a display device according to an embodiment of the disclosure.
Figure 5:
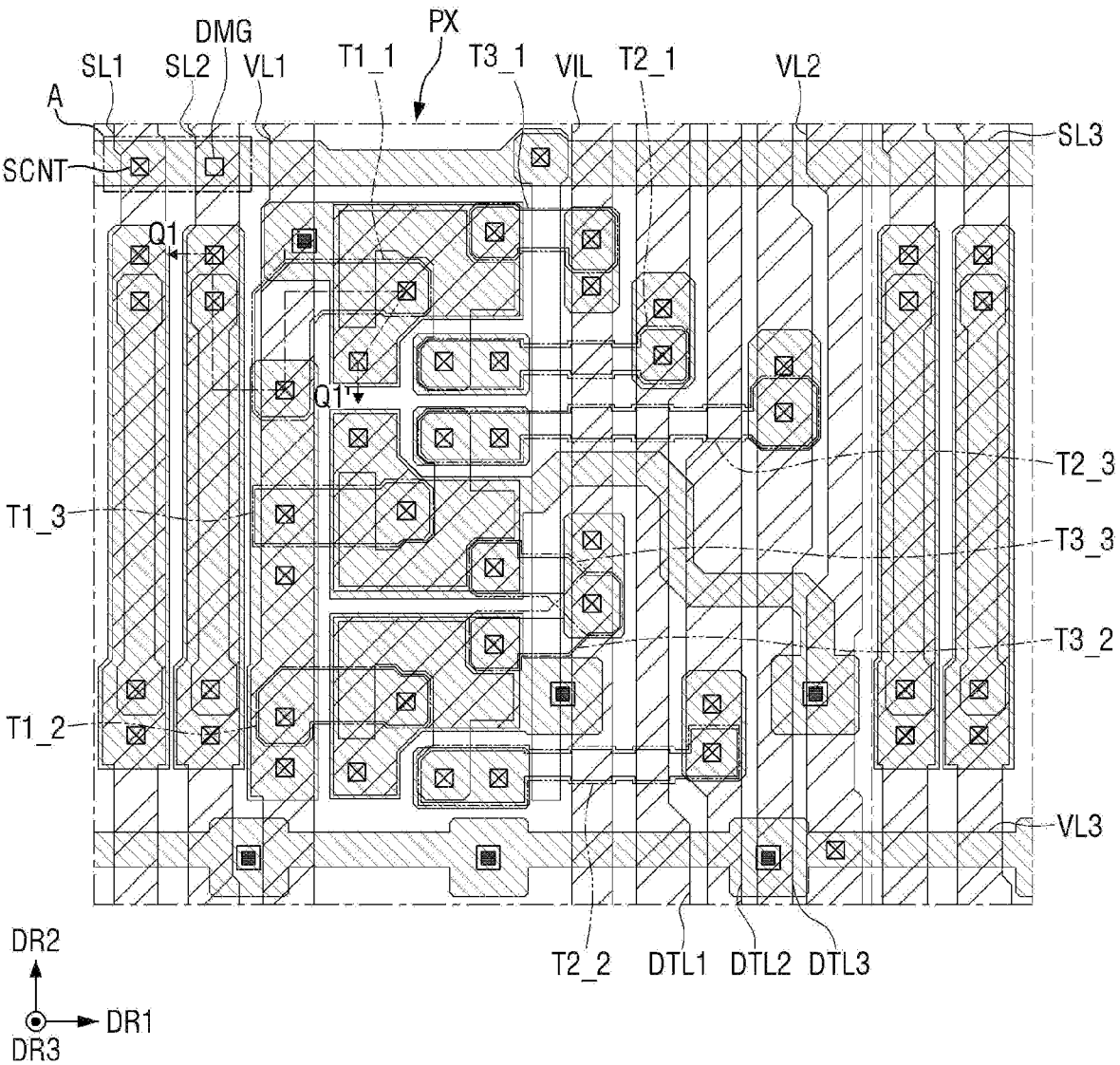
FIG. 5 is a schematic plan view illustrating a pixel and a periphery of a pixel of FIG. 4.
Figure 6:
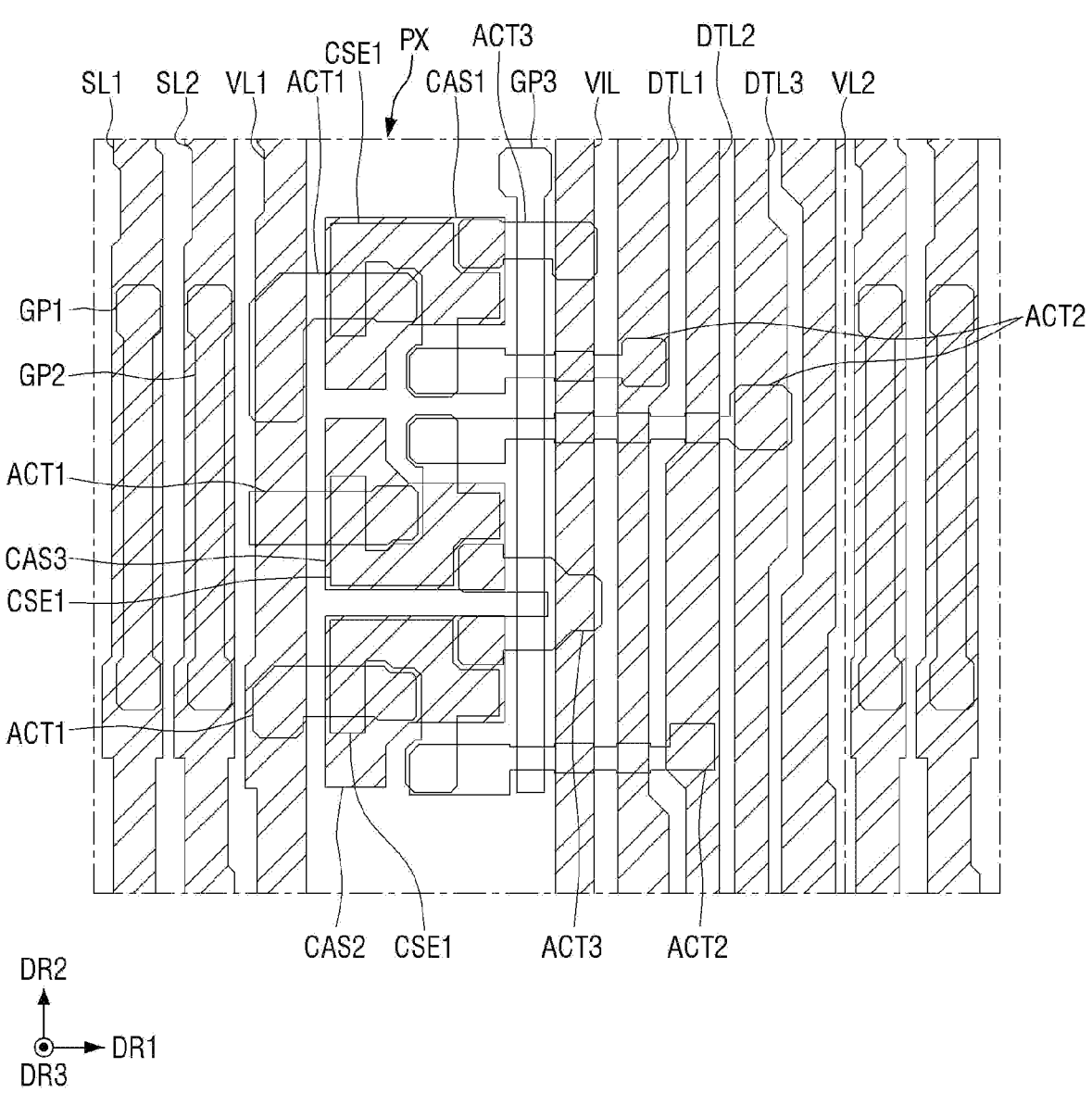
FIG. 6 is a schematic plan view illustrating a first conductive layer, a semiconductor layer and a second conductive layer of FIG. 5.
Figure 7:
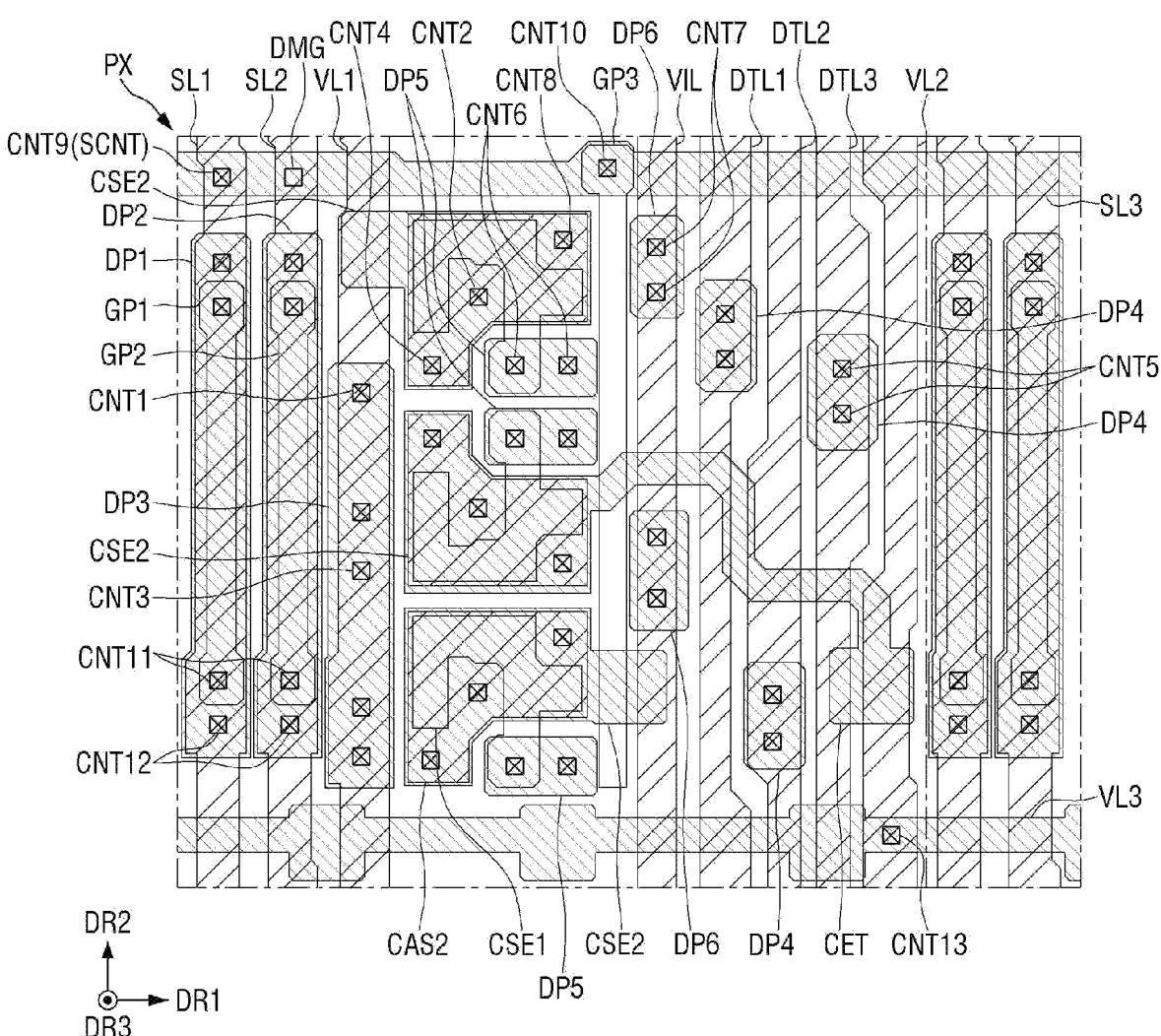
FIG. 7 is a schematic plan view illustrating a first conductive layer, a second conductive layer and a third conductive layer of FIG. 5.
Figure 8:
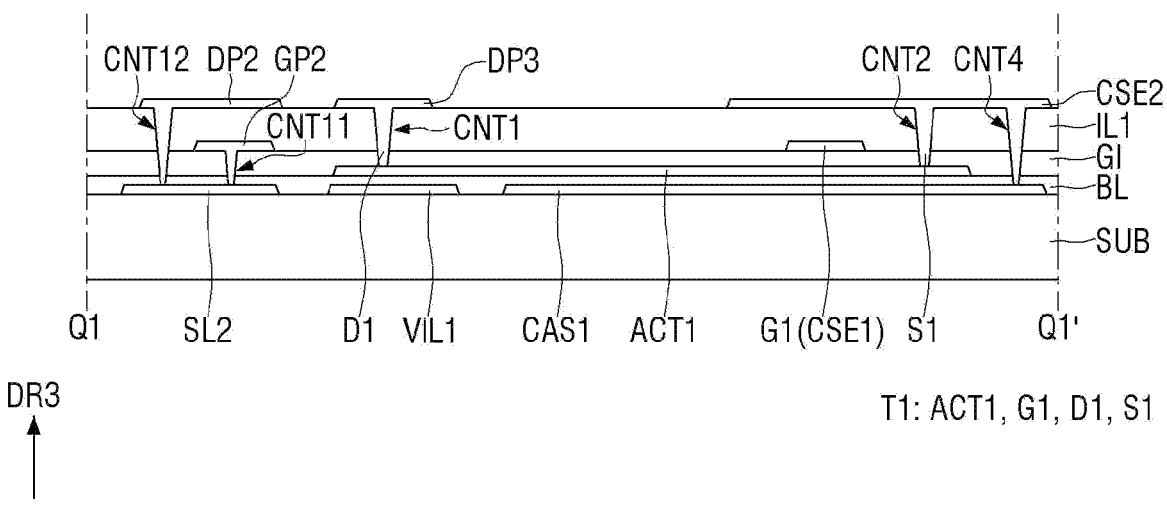
FIG. 8 is a schematic cross-sectional view taken along line Q1-Q1' of FIG. 5.

FIG. 4 is a schematic plan view illustrating pixels of a display device according to an embodiment of the disclosure. FIG. 5 is a schematic plan view illustrating a pixel and a periphery of a pixel of FIG. 4. FIG. 6 is a schematic plan view illustrating a first conductive layer, a semiconductor layer and a second conductive layer of FIG. 5. FIG. 7 is a schematic plan view illustrating a first conductive layer, a second conductive layer and a third conductive layer of FIG. 5. FIG. 8 is a schematic cross-sectional view taken along line Q1-Q1' of FIG. 5. FIG. 8 illustrates a cross-sectional view of a circuit layer of a display panel.

The display panel may include a circuit layer and a display element layer. First, the circuit layer will be described with reference to FIGS. 4 to 8.

Referring to FIGS. 4 to 8, the circuit layer of the display device 10 may include a substrate SUB, a semiconductor layer disposed on the substrate SUB, conductive layers, and insulating layers.

The substrate SUB may be an insulating substrate. The substrate SUB may be made of an insulating material such as glass, quartz or polymer resin. The substrate SUB may be a rigid substrate, but may also be a flexible substrate capable of performing bending, folding, rolling or the like.

The first conductive layer may be disposed on the substrate SUB. The first conductive layer may include a first scan line SL1, a second scan line SL2, data lines DTL (DTL1, DTL2 and DTL3), a first voltage line VL1, a second voltage line VL2, an initialization voltage line VIL, and lower metal layers CAS1, CAS2 and CAS3, which may be extended in the second direction DR2.

The scan lines SL may be disposed to be extended in the second direction DR2. A pixel PX may include the first scan line SL1 and the second scan line SL2, and each of the scan lines SL1 and SL2 may be disposed across multiple pixels PX arranged in the second direction DR2. The first scan line SL1 and the second scan line SL2 may be spaced apart from each other in the first direction DR1, and may be disposed to be adjacent to each other. A first scan line SL1 and a second scan line SL2 may be connected to a pixel PX, and the scan line connected to a pixel PX may be connected to the first to third subpixels SPX1, SPX2 and SPX3, respectively. The scan lines SL1 and SL2 may be connected to the second transistor T2 (FIG. 3) and the third transistor T3 (FIG. 3) through a conductive pattern disposed on another conductive layer to apply a scan signal to the second transistor T2 and the third transistor T3.

As described above, the first scan line SL1 and the second scan line SL2 may be disposed to be adjacent to each other, and may be disposed at a specific position within a pixel PX. In an embodiment, the first scan line SL1 and the second scan line SL2 may be disposed on a left side corresponding to the other side of the first direction DR1 at the center of the pixel PX.

The data lines DTL1, DTL2 and DTL3 may be disposed to be extended in the second direction DR2. The first data line DTL1, the second data line DTL2 and the third data line DTL3 may be disposed in a pixel PX, and each of the data lines DTL1, DTL2 and DTL3 may be disposed across multiple pixels PX arranged in the second direction DR2. The first data line DTL1, the second data line DTL2 and the third data line DTL3 may be spaced apart from one another in the first direction DR1 and may be disposed to be adjacent to one another. The first data line DTL1, the second data line DTL2 and the third data line DTL3 may sequentially be arranged along the first direction DR1, and these lines may respectively be connected with the second transistors T2_1, T2_2 and T2_3 (FIG. 5) of the subpixel SPXn (n may be an integer of 1 to 3).

As described above, the first to third data lines DTL1, DTL2 and DTL3 may be adjacent to one another, and may be disposed at a specific position within a pixel PX. The first to third data lines DTL1, DTL2 and DTL3 may be disposed on a side of the first direction DR1 of a pixel PX. The first to third data lines DTL1, DTL2 and DTL3 may be disposed between the second subpixel SPX2 (see FIG. 11) and the third subpixel SPX3 (see FIG. 11) in a pixel PX, but embodiments are not limited thereto.

The initialization voltage line VIL may be extended in the second direction DR2 and disposed across multiple pixels PX arranged in the second direction DR2. The initialization voltage line VIL may be at a left side of the first data line DTL1 in plan view, and may be disposed between the lower metal layers CAS1, CAS2 and CAS3 and the first data line DTL1, but is not limited thereto. The initialization voltage line VIL may be connected with a conductive pattern disposed on another conductive layer and thus electrically connected with the third transistors T3_1, T3_2 and T3_3 (FIG. 5) of the respective subpixels SPXn.

The first voltage line VL1 and the second voltage line VL2 may be disposed to be extended in the second direction DR2, and may be disposed across multiple pixels PX arranged in the second direction DR2. The first voltage line VL1 may be disposed between the second scan line SL2 and the lower metal layers CAS1, CAS2 and CAS3, and the second voltage line VL2 may be disposed at a right side corresponding to a side of the first direction DR1 of the third data line DT3. Each of the first voltage line VL1 and the second voltage line VL2 may be connected to multiple subpixels SPXn (see FIG. 3) belonging to a pixel PX.

The first voltage line VL1 may be connected to a first electrode RME1 (see FIG. 11) of each subpixel SPXn through the first transistors T1_1, T1_2 and T1_3 (FIG. 5), and the second voltage line VL2 may be connected to a second electrode RME2 (see FIG. 11) through the third voltage line VL3 disposed on another conductive layer. The first voltage line VL1 and the second voltage line VL2 may transfer the power voltage applied from the voltage line pads WPD_VL1 and WPD_VL2 (see FIG. 2) to the electrodes RME1 and RME2 (see FIG. 11) disposed in each subpixel SPXn. A high potential voltage (or first power voltage) transferred to the first electrode RME1 may be applied to the first voltage line VL1, and a low potential voltage (or second power voltage) transferred to the second electrode RME2 (see FIG. 11) may be applied to the second voltage line VL2.

The lower metal layers CAS1, CAS2 and CAS3 may be disposed between the first voltage line VL1 and the initialization voltage line VIL. The lower metal layers CAS1, CAS2 and CAS3 may be disposed to overlap a first active layer ACT1 of the semiconductor layer and a first capacitance electrode CSE1 of the second conductive layer, which will be described later. The first lower metal layer CAS1 may be disposed to overlap the first active layer ACT1 of the first transistor T1_1 connected to the first subpixel SPX1. The second lower metal layer CAS2 may be disposed to overlap the first active layer ACT1 of the first transistor T1_2 connected to the second subpixel SPX2, and the third lower metal layer CAS3 may be disposed to overlap the first active layer ACT1 of the first transistor T1_3 connected to the third subpixel SP3. The first to third lower metal layers CAS1, CAS2 and CAS3 may be spaced apart from one another in the second direction DR2, and may be disposed at the center of each of the pixels PX in plan view. For example, the first lower metal layer CAS1 may be disposed on an upper side that may be a side of the second direction DR2 at the center of the pixel PX, the second lower metal layer CA2 may be disposed on a lower side that may be another side of the second direction DR2 at the center of the pixel PX, and the third lower metal layer CAS3 may be disposed between the first lower metal layer CAS1 and the second lower metal layer CAS2.

The lower metal layers CAS1, CAS2 and CAS3 may include a material for blocking light, thereby preventing light from entering the first active layer ACT1 of the first transistor T1. For example, the lower metal layers CAS1, CAS2 and CAS3 may be formed of an opaque metal material for blocking transmission of light, but are not limited thereto. As the case may be, the lower metal layers CAS1, CAS2 and CAS3 may be omitted, or may be disposed to overlap the active layers of the transistors T1, T2 and T3.

A buffer layer BL may be disposed on the first conductive layer and the substrate SUB. The buffer layer BL may be formed on the substrate SUB to protect the transistors of the pixel PX from moisture permeated through the substrate SUB vulnerable to moisture permeation, and may perform a surface planarization function.

The semiconductor layer may be disposed on the buffer layer BL. The semiconductor layer may include active layers ACT1, ACT2 and ACT3 of the respective transistors T1, T2 and T3.

The semiconductor layer may include an oxide semiconductor. The oxide semiconductor may be an oxide semiconductor containing indium (In). For example, the oxide semiconductor may be at least one of Indium Tin Oxide (ITO), Indium Zinc Oxide (IZO), Indium Gallium Oxide (IGO), Indium Zinc Tin Oxide (IZTO), Indium Gallium Tin Oxide (IGTO), Indium Gallium Zinc Oxide (IGZO), and Indium Gallium Zinc Tin Oxide (IGZTO), but is not limited thereto. In another embodiment, the semiconductor layer may include polycrystalline silicon, monocrystalline silicon, and the like, or a combination thereof.

The first active layers ACT1 of the first transistors T1_1, T1_2 and T1_3 connected to the respective subpixels SPX1, SPX2 and SPX3 may be disposed on a left side at the center of each pixel PX. The first active layers ACT1 may be disposed in the area occupied by the first subpixel SPX1 (see FIG. 11). The first active layers ACT1 may be disposed to be spaced apart from each other in the second direction DR2, and a portion thereof may be disposed to overlap the lower metal layers CAS1, CAS2 and CAS3, the first capacitance electrode CSE1 of the second conductive layer, a third conductive pattern DP3 of the third conductive layer, and a second capacitance electrode CSE2 of the third conductive layer. For example, each of the first active layers ACT1 may include a first area overlapping the third conductive pattern DP3, a second area overlapping the first capacitance electrode CSE1, and a third area overlapping the second capacitance electrode CSE2 as a portion other than the first area and the second area.

The active layers ACT2 of the second transistors T2_1, T2_2 and T2_3 connected to the respective subpixels SPX1, SPX2 and SPX3 may be disposed to be adjacent to the center of each pixel PX. The second active layer ACT2 may be disposed in the area occupied by the second subpixel SPX2 (see FIG. 11). The second active layers ACT2 may be disposed to be spaced apart from each other in the second direction DR2, and a portion thereof may be disposed to overlap a third gate pattern GP3 of the second conductive layer and a fourth conductive pattern DP4 and a fifth conductive pattern DP5 of the third conductive layer. For example, the second active layer ACT2 may include a first area overlapping the fourth conductive pattern DP4, a second area overlapping the third gate pattern GP3, and a third area overlapping the fifth conductive pattern DP5 as a portion other than the first area and the second area. The first area of the second active layer ACT2 may be in contact with the fourth conductive pattern DP4, and the third area of the second active layer ACT2 may be in contact with the fifth conductive pattern DP5.

The second active layers ACT2 of the second transistors T2 may have different lengths depending on the arrangement of the data lines DTL1, DTL2 and DTL3. For example, the first data line DTL1, the second data line DTL2 and the third data line DTL3 may sequentially be disposed in a side direction of the first direction DR1 from the area where the second active layers ACT2 may be disposed, and the second active layers ACT2 of the respective second transistors T2 may have different lengths depending on the positions of the data lines DTL1, DTL2 and DTL3 connected thereto.

The third active layers ACT3 of the respective third transistors T3_1, T3_2 and T3_3 may also be disposed at the center of the pixel PX. The third active layers ACT3 may also be disposed in the area occupied by the second subpixel SPX3 (see FIG. 11). The third active layers ACT3 may be disposed to be spaced apart from each other in the second direction DR2 and disposed in parallel with the second active layers ACT2 in the second direction DR2. A portion of the third active layers ACT3 may be disposed to overlap the third gate pattern GP3 of the second conductive layer, a sixth conductive pattern DP6 of the third conductive layer, and the second capacitance electrode CSE2. For example, the third active layer ACT3 may include a first area overlapping the sixth conductive pattern DP6, a second area overlapping the third gate pattern GP3, and a third area overlapping the second capacitance electrode CSE2 as a portion other than the first area and the second area. The first area of the third active layer ACT3 may be in contact with the sixth conductive pattern DP6, and the third area thereof may be in contact with the second capacitance electrode CSE2.

The third active layers ACT3 of the third transistors T3_2 and T3_3 may partially be integrated with each other in the first areas overlapping the sixth conductive pattern DP6. Since the third transistors T3 of the respective subpixels SPXn (see FIG. 3) may be turned on at the same time, the third active layers ACT3 of the different transistors may partially be integrated with each other.

A first gate insulating layer GI may be disposed on the semiconductor layer and the buffer layer BL. The first gate insulating layer GI may serve as a gate insulating layer of the first transistor T1.

The second conductive layer may be disposed on the first gate insulating layer GI. The second conductive layer may include gate patterns GP1, GP2 and GP3 and a first capacitance electrode CSE 1.

The first gate pattern GP1 and the second gate pattern GP2 may have a shape extended in the second direction DR2, and may be disposed on the left side of each pixel PX. The first gate pattern GP1 and the second gate pattern GP2 may be disposed to overlap the first scan line SL1 and the second scan line SL2, respectively. The first gate pattern GP1 may directly be connected with the first scan line SL1 through an eleventh contact hole CNT11 that passes through the buffer layer BL and the first gate insulating layer GI, and the second gate pattern GP2 may directly be connected with the second scan line SL2 through the eleventh contact hole CNT11 that passes through the buffer layer BL and the first gate insulating layer GI. The first gate pattern GP1 and the second gate pattern GP2 may prevent intensity of the scan signal applied from the pad area PDA through the first scan line SL1 and the second scan line SL2 from being lowered in accordance with the position of the display area DPA.

The third gate pattern GP3 may have a shape extended in the second direction DR2, and may be disposed at the center of each pixel PX. The third gate pattern GP3 may be extended from the upper side of the pixel PX in the second direction DR2 to overlap the second active layers ACT2 and third active layers ACT3. For example, the third gate pattern GP3 may overlap the second area of the second active layers ACT2 and the second area of the third active layers ACT3. The third gate pattern GP3 may serve as the second gate electrode G2 of the second transistor T2 and the third gate electrode G3 of the third transistor T3. As described below, the third gate pattern GP3 may be connected with the first scan line SL1 or the second scan line SL2 through the third scan line SL3, and the scan signal may be transferred to the second transistor T2 and the third transistor T3 through the third gate pattern GP3.

The first capacitance electrodes CSE1 may be spaced apart from each other in the first direction DR1 and disposed between the second gate pattern GP2 and the third gate pattern GP3. A portion of each of the first capacitance electrodes CSE1 may overlap the lower metal layer CAS1, CAS2 and CAS3, the first active layer ACT1, and the second capacitance electrode CSE2 of the third conductive layer. For example, a portion of each of the first capacitance electrodes CSE1 may overlap the second area of the first active layer ACT1, and may serve as a first gate electrode G1 of the first transistor T1. As described below, the first capacitance electrode CSE1 may be connected with the fourth conductive pattern DP4, and may transfer the data signal applied through the second transistor T2 to the first gate electrode G1 of the first transistor T1. In addition, the first capacitance electrode CSE1 may overlap the second capacitance electrode CSE2 to constitute the storage capacitor Cst.

A first interlayer insulating layer IL1 may be disposed on the second conductive layer. The first interlayer insulating layer IL1 may serve as an insulating layer between the second conductive layer and other layers disposed on the second conductive layer, and may protect the second conductive layer.

The third conductive layer may be disposed on the first interlayer insulating layer IL1. The third conductive layer may include a third scan line SL3, a third voltage line VL3, and conductive patterns DP1, DP2, DP3, DP4, DP5 and DP6.

The third scan line SL3 may be extended in the first direction DR1 and disposed across the multiple pixels PX arranged in the first direction DR1. The third scan line SL3 may be disposed on the upper side of each pixel PX in plan view, and may be disposed across a non-light emission area. The third scan line SL3 may be connected with the first scan line SL1 or the second scan line SL2 of the first conductive layer. The third scan line SL3 may be connected with the first scan line SL1 or the second scan line SL2 through a scan contact hole SCNT (or ninth contact hole CNT9) that passes through the buffer layer BL, the first gate insulating layer GI and the first interlayer insulating layer IL1.

The third scan line SL3 may be connected with any one of the first scan line SL1 or the second scan line SL2 disposed in any pixel PX. For example, when the third scan line SL3 may be connected with the first scan line SL1 disposed in a pixel PX, the corresponding third scan line SL3 may not be connected with another second scan line SL2 disposed in the same row as the corresponding pixel PX. Another third scan line SL3, which may be spaced apart from the corresponding third scan line SL3 in the second direction DR2, may be connected to the other scan lines SL1 and SL2 other than the first scan line SL1 disposed in the pixel PX.

The third scan line SL3 may be connected with the third gate pattern GP3 of the second conductive layer, and may be connected to the second transistor T2 and the third transistor T3. The third scan line SL3 may be connected with the third gate pattern GP3 through a tenth contact hole CNT10 that passes through the first interlayer insulating layer ILL A third scan line SL3 may be connected with each of the third gate patterns GP3 disposed in the pixels PX of the same row. The third scan line SL3 may transfer the scan signal to the gate electrodes of the second transistor T2 and the third transistor T3 through the first scan line SL1 or the second scan line SL2 and the third gate pattern GP3.

The display device 10 may further include a recess pattern DMG. The recess pattern DMG may be disposed in an area where the third scan line SL3 intersects and may be insulated from at least one of the first scan line SL1 and the second scan line SL2. This will be described in more detail with reference to FIGS. 9 and 10.

Figure 9:
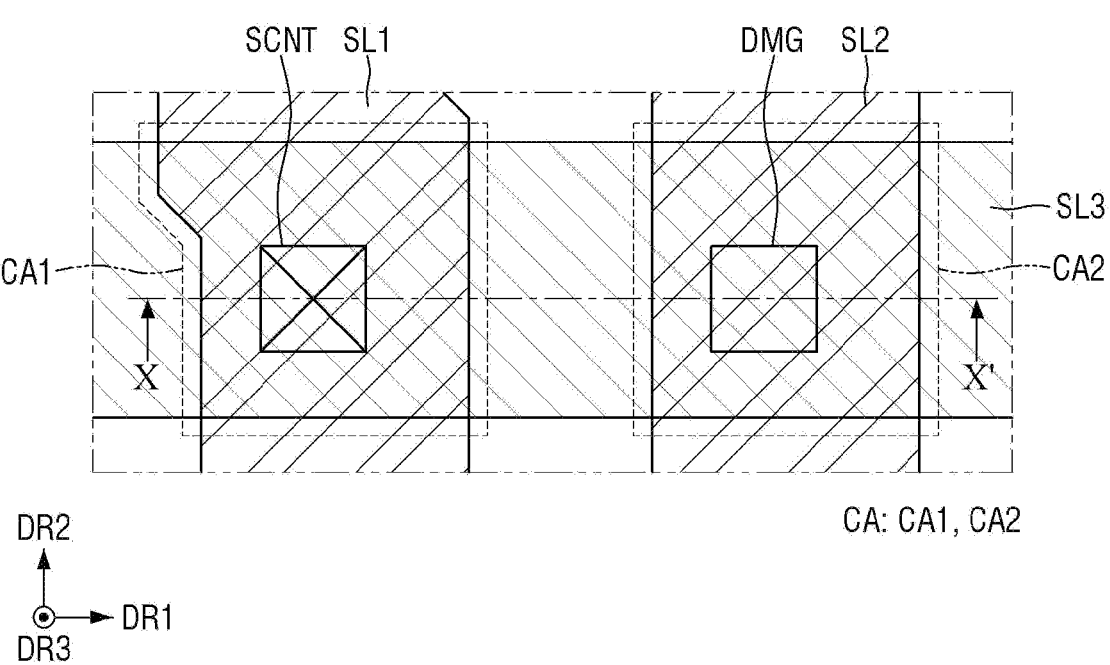
FIG. 9 is an enlarged schematic view illustrating area A of FIG. 5.
Figure 10:
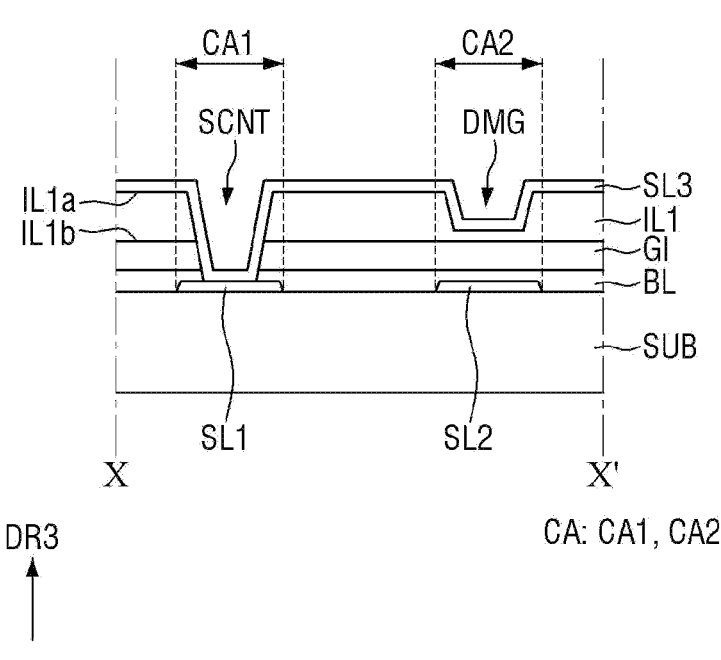
FIG. 10 is a schematic cross-sectional view taken along line X-X' of FIG. 9.

FIG. 9 is an enlarged schematic view illustrating area A of FIG. 5. FIG. 10 is a schematic cross-sectional view taken along line X-X' of FIG. 9.

Referring to FIGS. 4, 5, 9 and 10, the display device may include an overlap area CA in which each of the first scan line SL1 and the second scan line SL2 overlaps the third scan line SL3. In the overlap area CA, the third scan line SL3 may intersect each of the first scan line SL1 and the second scan line SL2. The overlap area CA may include a first overlap area CA1 and a second overlap area CA2, a first of which may be electrically connected to one of the first scan line SL1 and the second scan line SL2, and a second of which where the third scan line SL3 may be insulated from the first scan line SL1 and/or the second scan line SL2.

In the overlap area CA, the third scan line SL3 may electrically be connected with at least one of the first scan line SL1 and the second scan line SL2. In other words, in the first overlap area CA1, the third scan line SL3 may overlap and intersect the first scan line SL1 and may electrically be connected with the first scan line SL1. Alternatively, in the second overlap area CA2, the third scan line SL3 may overlap and intersect the second scan line SL2 and may electrically be connected with the second scan line SL2.

A scan contact hole SCNT may be disposed in the overlap area CA. The scan contact hole SCNT may pass through the buffer layer BL, the first gate insulating layer GI and the first interlayer insulating layer IL1 in a thickness direction (third direction DR3) to expose at least one of the first scan line SL1 and the second scan line SL2. Through the scan contact hole SCNT, the third scan line SL3 may electrically be connected with at least one of the first scan line SL1 and the second scan line SL2.

In the overlap area CA, the third scan line SL3 may electrically be insulated from the first scan line SL1 and/or the second scan line SL2. In other words, in the second overlap area CA2, the third scan line SL3 may overlap and intersect the second scan line SL2 and may electrically be insulated from the second scan line SL2. Alternatively, in the first overlap area CS1 the third scan line SL3 may overlap and intersect the first scan line SL1 and may electrically be insulated from the first scan line SL2.

A recess pattern DMG may be disposed in the second overlap area CA2. The recess pattern DMG may be defined by an insulating layer disposed between the first conductive layer and the third conductive layer. Insulating layers may be disposed between the first conductive layer and the third conductive layer. For example, the insulating layer disposed between the first conductive layer and the third conductive layer may include a buffer layer BL, a first gate insulating layer GI and a first interlayer insulating layer ILL and the recess pattern DMG may be defined by at least a portion of the buffer layer BL, the first gate insulating layer GI and the first interlayer insulating layer IL1.

The recess pattern DMG may include a shape recessed from the uppermost surface of the insulating layer disposed between the first conductive layer and the third conductive layer toward the lowermost surface. For example, the first interlayer insulating layer IL1 may include an upper surface IL1a and a lower surface IL1b opposite to the upper surface IL1a. The third scan line SL3 may be disposed on the upper surface IL1a of the first interlayer insulating layer ILL and the lower surface IL1b of the first interlayer insulating layer IL1 may be opposite to the first gate insulating layer GI. In this case, the recess pattern DMG may include a shape recessed from the upper surface IL1a toward the lower surface IL1b, but the shape of the recess pattern DMG is not limited thereto.

The third scan line SL3 may be disposed in the recess pattern DMG. The recess pattern DMG may be disposed on the first scan line SL1 and the second scan line SL2 in the overlap area CA, and may overlap at least one of the first scan line SL1 and the second scan line SL2. Even though the recess pattern DMG may be disposed to overlap the first scan line SL1 or the second scan line SL2, the recess pattern DMG may not expose the first scan line SL1 or the second scan line SL2, and the insulating layer may be at least partially disposed between at least one of the first and second scan lines SL1 and SL2 and the third scan line SL3.

The number of the recess patterns DMG may be more than the number of scan contact holes SCNT. In other words, a third scan line SL3 may overlap and intersect multiple first scan lines SL1 and multiple second scan lines SL2. Among multiple pixels PX through which a third scan line SL3 passes, there may be pixels connected and pixels not connected. For example, in a pixel PX where one of the first scan line SL1 and the second scan line SL2 may be connected with the third scan line SL3, the other one of the first scan line SL1 and the second scan line SL2 may intersect the third scan line SL3 and electrically be insulated from the third scan line SL3. In addition, among multiple pixels PX through which a third scan line SL3 passes, the number of pixels PX electrically connected with the third scan line SL3 may be smaller than the number of pixels PX that may not be electrically connected with the third scan line SL3. Therefore, among multiple first scan lines SL1 and multiple second scan lines SL2 that intersect a third scan line SL3, the number of scan lines electrically connected with the third scan line SL3 may be less than the number of scan lines electrically insulated from the third scan line SL3.

The recess pattern DMG may be disposed in all areas (all of the second overlap areas CA2) in which the third scan line SL3 may be electrically insulated from the first scan lines SL1 or the second scan lines SL2 among overlap areas where the third scan lines SL3 intersect the first scan lines SL1 and the second scan lines SL2, but is not limited thereto. The recess pattern DMG may be disposed only on a portion of the second overlap areas CA2.

The recess pattern DMG may be formed together with the scan contact hole SCNT through one mask during the process of forming the scan contact hole SCNT. For example, in case that a half-tone mask is used, the scan contact hole SCNT that exposes the first scan line SL1 or the second scan line SL2 in the first overlap area CA1 and the recess pattern DMG that may not expose the first scan line SL1 or the second scan line SL2 in the second overlap area CA2 may be formed simultaneously. However, the method of forming the recess pattern DMG and the scan contact hole SCNT is not limited to this example. in case that the recess pattern DMG is formed by the same process as that of the scan contact hole SCNT, a separate mask may not be required, whereby decrease of process efficiency may be suppressed or avoided, and increase of the process cost may be suppressed or avoided.

As the recess pattern DMG may be disposed in an overlap area (e.g., the second overlap area CA2), pattern recognition defects that may be detected during an auto optical inspection AOI may be suppressed or prevented from occurring. In other words, referring to FIG. 4, in case that the recess pattern DMG is not disposed in the second overlap area CA2 and the scan contact hole SCNT is disposed only in the first overlap area CA1, the scan contact hole SCNT may be only disposed in the area where the third scan line SL3 may be electrically connected with the first scan line SL1, whereby the arrangement of the scan contact hole SCNT may not have periodicity. Alternatively, even though the arrangement of the scan contact hole SCNT has periodicity, a unit image of the auto optical inspection may not include all of the periodicity of the scan contact hole SCNT.

Therefore, in case of an auto optical inspection for inspecting whether there may be a defect through a comparison with a unit image, an error detection defect may be generated by detecting a non-defective case as a defect due to the arrangement of the scan contact hole SCNT. However, in case that the scan contact hole SCNT is not disposed and the recess pattern DMG is disposed in the area (e.g., second overlap area CA2) where the third scan line SL3 intersects the first scan line SL1 or the second scan line SL2, the scan contact hole SCNT and the recess pattern DMG may make sure of periodicity over the entire area. Therefore, detection of a non-defect as a defect may be suppressed or avoided. Since the defect may be inspected over the entire area of the display device 10 regardless of whether the scan contact hole SCNT may be disposed, reliability of the display device 10 may be improved. In addition, a separate program for separately recognizing the arrangement of the scan contact hole SCNT may not be required, and increase of inspection costs may be suppressed or avoided.

Referring back to FIGS. 4 to 8, the third voltage line VL3 may be extended in the first direction DR1 and disposed over the pixels PX arranged in the first direction DR1. The third voltage line VL3 may be disposed on the lower side of each pixel PX in plan view, and may be disposed across the non-light emission area of each of the subpixels SPXn. The third voltage line VL3 may be connected with any one of the first voltage line VL1 or the second voltage line VL2.

The third voltage line VL3 may include a first sub-voltage line VL31 and a second sub-voltage line VL32. The first sub-voltage line VL31 may be connected with the first voltage line VL1, and the second sub-voltage line VL32 may be connected with the second voltage line VL2. Any one of the first sub-voltage line VL31 and the second sub-voltage line VL32 may be disposed in the pixels PX arranged along the first direction DR1. The first sub-voltage line VL31 and the second sub-voltage line VL32 may be spaced apart from each other in the second direction DR2, and may alternately be disposed along the second direction DR2.

For example, in the pixel row (pixels PX arranged in the first direction DR1) in which the first voltage line VL1 may be connected with the first sub-voltage line VL31, the first sub-voltage line VL31 may be connected with the third conductive pattern DP3 of the third conductive layer. The first sub-voltage line VL31 and the third conductive pattern DP3 may be connected with each other by being integrated with each other, and the first sub-voltage line VL31 may be connected with the first voltage line VL1 through the third conductive pattern DP3. The second sub-voltage line VL32 may be disposed in a pixel row adjacent to the pixel row, in which the first sub-voltage line VL31 may be disposed, in the second direction DR2. The second voltage line VL2 and the second sub-voltage line VL32 may be connected with each other in the pixel row in which the second sub-voltage line VL32 may be disposed. The pixel row in which the first sub-voltage line VL31 may be disposed and the pixel row in which the second sub-voltage line VL32 may be disposed may alternately be repeated along the second direction DR2. The second sub-voltage line VL32 may be connected with the second voltage line VL2 in a portion overlapping the second voltage line VL2 through a thirteenth contact hole CNT13 that passes through the buffer layer BL, the first gate insulating layer GI and the first interlayer insulating layer ILL In this case, the second sub-voltage line VL32 may be spaced apart from the third conductive pattern DP3 by being separated from the third conductive pattern DP3.

The multiple voltage lines VL; VL1, VL2 and VL3 may be extended from the front surface of the display area DPA in the second direction DR2 and the first direction DR1 and disposed in a mesh structure. The first voltage line VL1 and the second voltage line VL2 may be formed of a first conductive layer, and may be extended in the second direction DR2 and disposed in each pixel PX. The third voltage line VL3 may be formed of a third conductive layer, and may be extended in the first direction DR1 and disposed in pixels PX of different rows, whereby the third voltage line VL3 may be disposed on the front surface of the display area DPA in a mesh shape.

In addition, the pixel rows may be distinguished from each other depending on whether the third voltage line VL3 may be connected with the first voltage line VL1 or the second voltage line VL2. Even though the third voltage line VL3 may be disposed to be alternate with another type line depending on connection with the other voltage lines VL1 and VL2, the voltage lines VL may be connected to all pixels PX depending on connection of the first voltage line VL1 and the second voltage line VL2. Therefore, the number of lines disposed in the display area DPA may further be reduced, and a voltage drop (IR drop) of the voltage applied through the voltage line may be avoided in a large sized display device. The arrangement and connection of the voltage lines VL; VL1, VL2 and VL3 will be described later with reference to other drawings.

The second capacitance electrodes CSE2 may be spaced apart from each other in the first direction DR1 and disposed to overlap the first capacitance electrode CSE1 and the lower metal layers CAS1, CAS2 and CAS3. The second capacitance electrode CSE2 may be spaced apart from the first capacitance electrode CSE1 with the first interlayer insulating layer IL1 interposed therebetween, and the storage capacitor Cst may be formed therebetween. Among the second capacitance electrodes CSE2, the second capacitance electrode CSE2 disposed at the upper side of the pixel PX may form the storage capacitor Cst of the first subpixel SPX1, the second capacitance electrode Cse2 disposed at the lower side of the pixel PX may form the storage capacitor Cst of the second subpixel SPX2, and the second capacitance electrode CSE2 disposed at the center of the pixel PX may form the storage capacitor Cst of the third subpixel SPX3.

A portion of the second capacitance electrode CSE2 may be disposed to overlap the first active layer ACT1 and the third active layer ACT3. Each second capacitance electrode CSE2 may be connected with the first active layer ACT1 in a portion overlapping the first active layer ACT1 through a second contact hole CNT2 that passes through the first gate insulating layer GI and the first interlayer insulating layer ILL and may serve as a first source electrode S1 of the first transistor T1. Also, the second capacitance electrode CSE2 may be connected with the lower metal layers CAS1, CAS2 and CAS3 through a fourth contact hole CNT4 that passes through the buffer layer BL, the first gate insulating layer GI and the first interlayer insulating layer ILL In addition, each second capacitance electrode CSE2 may be connected with the third active layer ACT3 in a portion overlapping the third active layer ACT3 through an eighth contact hole CNT8 that passes through the first gate insulating layer GI and the first interlayer insulating layer ILL and may serve as the third source electrode S3 of the third transistor T3.

Each second capacitance electrode CSE2 may be connected with a first electrode RME1 disposed on a via layer VIA, which will be described later. The second capacitance electrodes CSE2, which form the storage capacitors Cst of the first subpixel SPX1 and the second subpixel SPX2, may be disposed to overlap the first electrode RME1 of the corresponding subpixel PX1 in the third direction DR3 that may be a thickness direction, and may be connected to each other in a portion overlapping each other through a first electrode contact hole CTD. However, the second capacitance electrode CSE2 connected with the first electrode RME1 of the third subpixel SP3 may not overlap the corresponding first electrode RME1 in the thickness direction. The third conductive layer may include an electrode connection portion CET connected with any one of the second capacitance electrodes CSE2, and the first electrode RME1 disposed in the third subpixel SP3 may be connected with the second capacitance electrode CSE2 through the electrode connection portion CET.

The first conductive pattern DP1 and the second conductive pattern DP2 may have a shape extended in the second direction DR2, and may be disposed at the left side of each pixel PX. The first conductive pattern DP1 may be disposed to overlap the first scan line SL1 and the first gate pattern GP1, and the second conductive pattern DP2 may be disposed to overlap the second scan line SL2 and the second gate pattern GP2. The first conductive pattern DP1 may directly be connected with the first scan line SL1 through a twelfth contact hole CNT12 that passes through the buffer layer BL and the first gate insulating layer GI, and the second conductive pattern DP2 may directly be connected with the second scan line SL2 through the twelfth contact hole CNT12 that passes through the buffer layer BL and the first gate insulating layer GI.

The third conductive pattern DP3 may have a shape extended in the second direction DR2, and may be disposed between the second conductive pattern DP2 and the second capacitance electrode CSE2. The third conductive pattern DP3 may partially overlap the first voltage line VL1 and the first active layer ACT1, and may be connected with them, respectively. The third conductive pattern DP3 may be in contact with the first voltage line VL1 through a third contact hole CNT3 that passes through the buffer layer BL, the first gate insulating layer GI and the first interlayer insulating layer ILL and may be in contact with the first active layer ACT1 through a first contact hole CNT1 that passes through the first gate insulating layer GI and the first interlayer insulating layer ILL The third conductive pattern DP3 may serve as the first drain electrode D1 of the first transistor T1. Also, as described above, the third conductive pattern DP3 may be disposed to be connected with or spaced apart from the third voltage line VL3.

The fourth conductive patterns DP4 may be disposed to overlap the second active layer ACT2 and one of the data line DTL, and the fifth conductive patterns DP5 may be disposed to overlap the second active layer ACT2 and the first capacitance electrode CSE1. The fourth conductive patterns DP4 may be in contact with the data line DTL through a fifth contact hole CNT5 that passes through the buffer layer BL, the first gate insulating layer GI and the first interlayer insulating layer ILL and may be in contact with the second active layer ACT2 through a fifth contact hole CNT5 that passes through the first gate insulating layer GI and the first interlayer insulating layer IL1. The fourth conductive pattern DP4 may serve as a second drain electrode D2 of the second transistor T2. The fifth conductive patterns DP5 may be in contact with the first capacitance electrode CSE1 through a sixth contact hole CNT6 that passes through the first interlayer insulating layer ILL and may be in contact with the second active layer ACT2 through a sixth contact hole CNT6 that passes through the first gate insulating layer GI and the first interlayer insulating layer ILL The fifth conductive pattern DP5 may serve as a second source electrode S2 of the second transistor T2.

The sixth conductive patterns DP6 may be disposed to overlap the initialization voltage line VIL and the third active layer ACT3. The sixth conductive patterns DP6 may be in contact with the initialization voltage line VIL through a seventh contact hole CNT7 that passes through the buffer layer BL, the first gate insulating layer GI and the first interlayer insulating layer ILL and may be in contact with the third active layer ACT3 through a seventh contact hole CNT7 that passes through the first gate insulating layer GI and the first interlayer insulating layer IL1. The sixth conductive pattern DP6 may serve as a third drain electrode D3 of the third transistor T3.

The conductive layer below the via layer VIA may be comprised of first to third conductive layers in the drawing, but is not limited thereto. In some embodiments, the display device 10 may further include a fourth conductive layer disposed between the third conductive layer and the via layer VIA, wherein the fourth conductive layer may include several conductive patterns.

The aforementioned buffer layer BL, first gate insulating layer GI and first interlayer insulating layer IL1 may be made of inorganic layers that may be alternately deposited. For example, the buffer layer BL, the first gate insulating layer GI and the first interlayer insulating layer IL1 may be formed of a double layer in which inorganic layers including at least one of silicon oxide (SiOx), silicon nitride (SiNx), and silicon oxynitride (SiOxNy) may be deposited, or multiple layers in which the inorganic layers may be alternately deposited. However, without limitation to this example, the buffer layer BL, the first gate insulating layer GI and the first interlayer insulating layer IL1 may be made of one inorganic layer including the insulating material described above. Also, in some embodiments, the first interlayer insulating layer IL1 may be made of an organic insulating material such as polyimide (PI).

The second conductive layer and the third conductive layer may be formed of, but embodiments are not limited to, a single layer or multiple layers made of one of molybdenum (Mo), aluminum (Al), chromium (Cr), gold (Au), titanium (Ti), nickel (Ni), neodymium (Nd) and copper (Cu), or their alloy.

Figure 11:
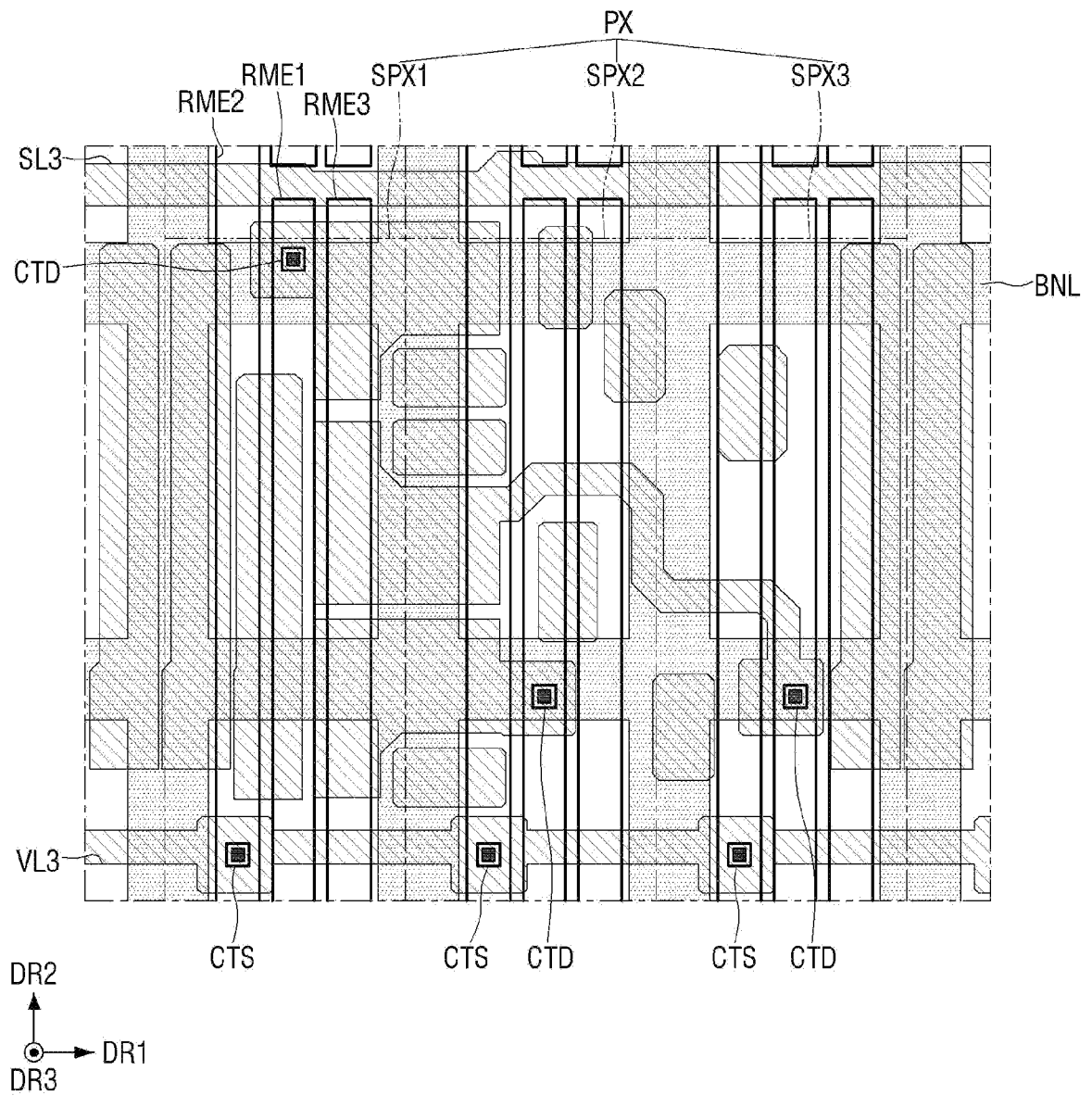
FIG. 11 is a schematic plan view illustrating electrodes disposed on the third conductive layer of FIG. 5.
Figure 12:
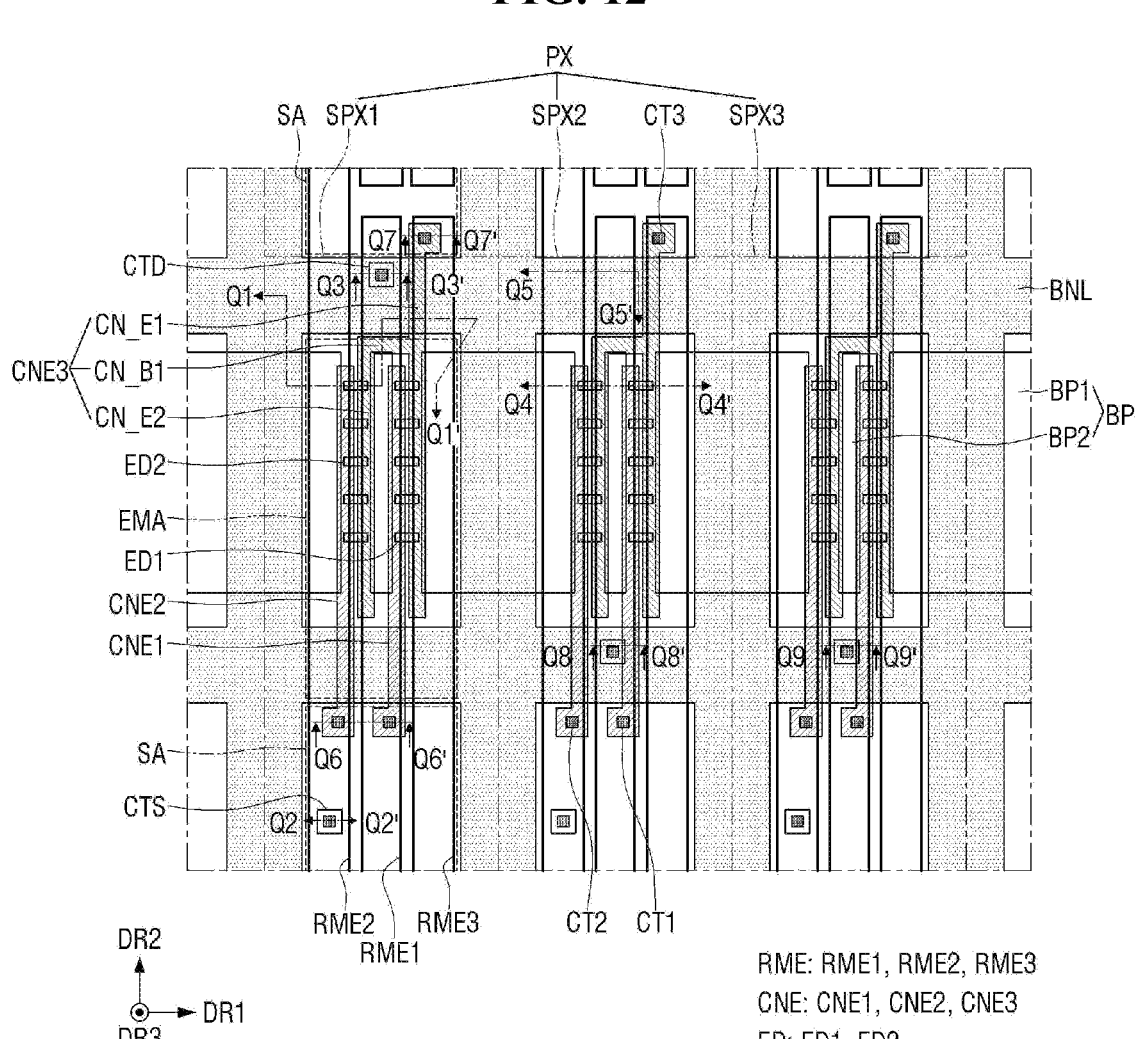
FIG. 12 is a schematic plan view illustrating electrodes and a bank, which are included in a pixel of a display device according to an embodiment of the disclosure.
Figure 13:
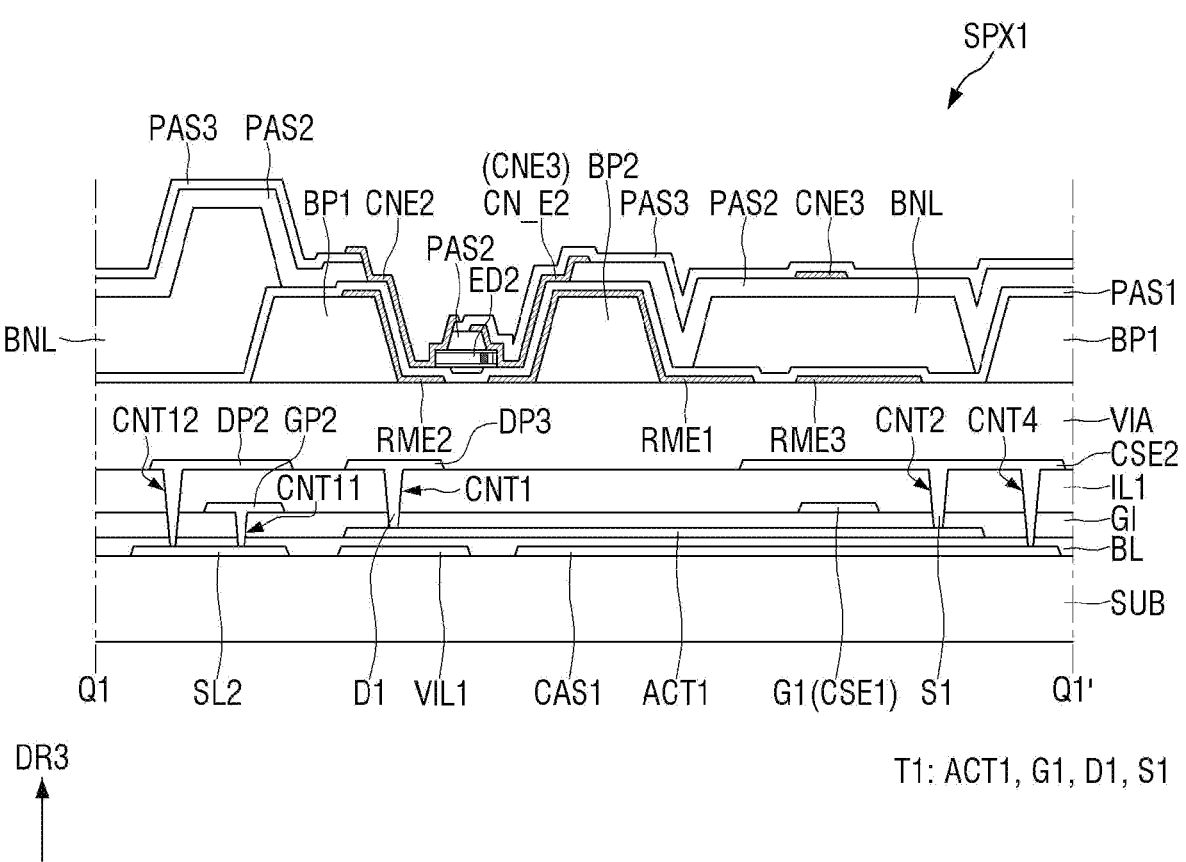
FIG. 13 is a schematic cross-sectional view taken along line Q1-Q1' of FIG. 5 and FIG. 12.
Figure 14:
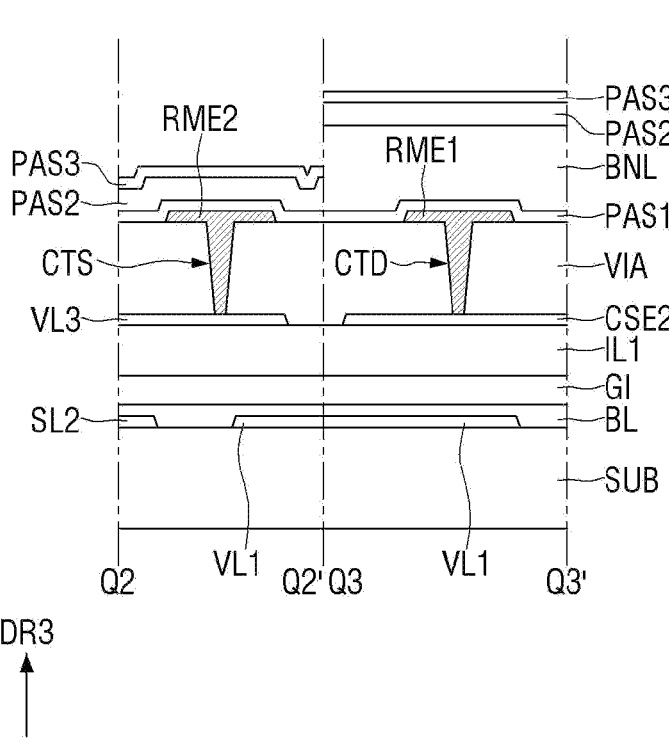
FIG. 14 is a schematic cross-sectional view taken along lines Q2-Q2' and Q3-Q3' of FIG. 5 and FIG. 12.
Figure 15:
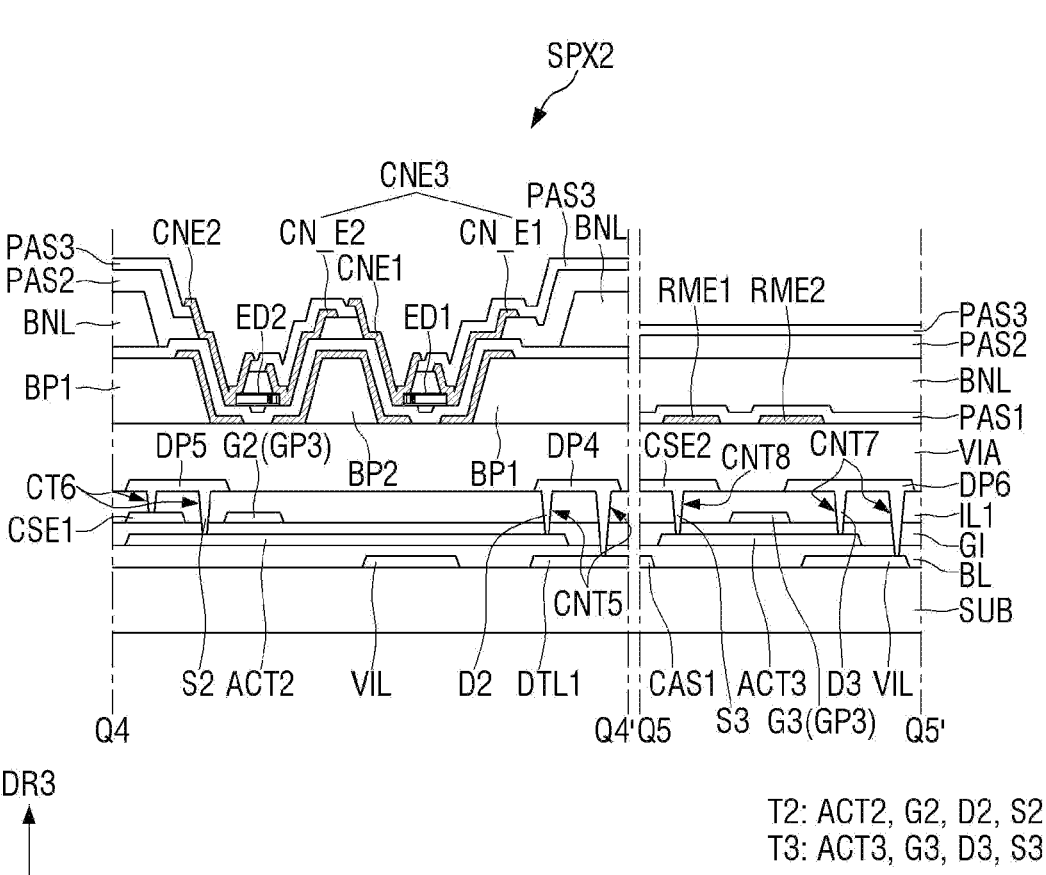
FIG. 15 is a schematic cross-sectional view taken along lines Q4-Q4' and Q5-Q5' of FIG. 5 and FIG. 12.
Figure 16:
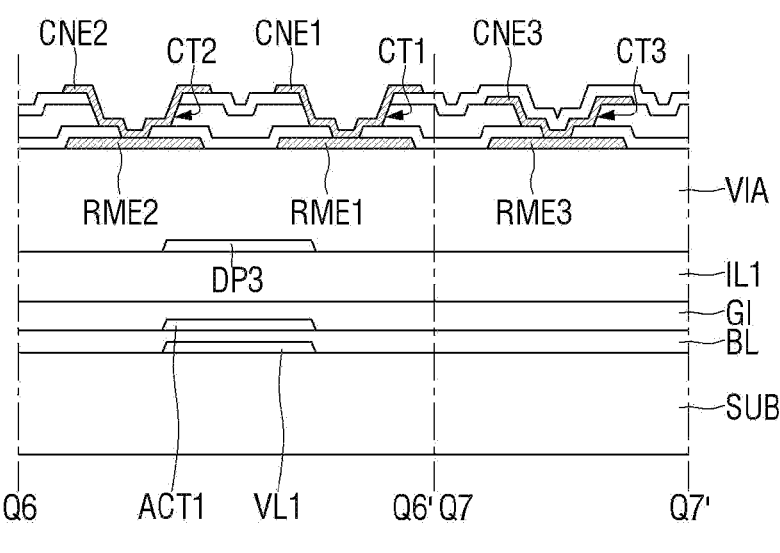
FIG. 16 is a schematic cross-sectional view taken along lines Q6-Q6' and Q7-Q7' of FIG. 5 and FIG. 12.
Figure 17:
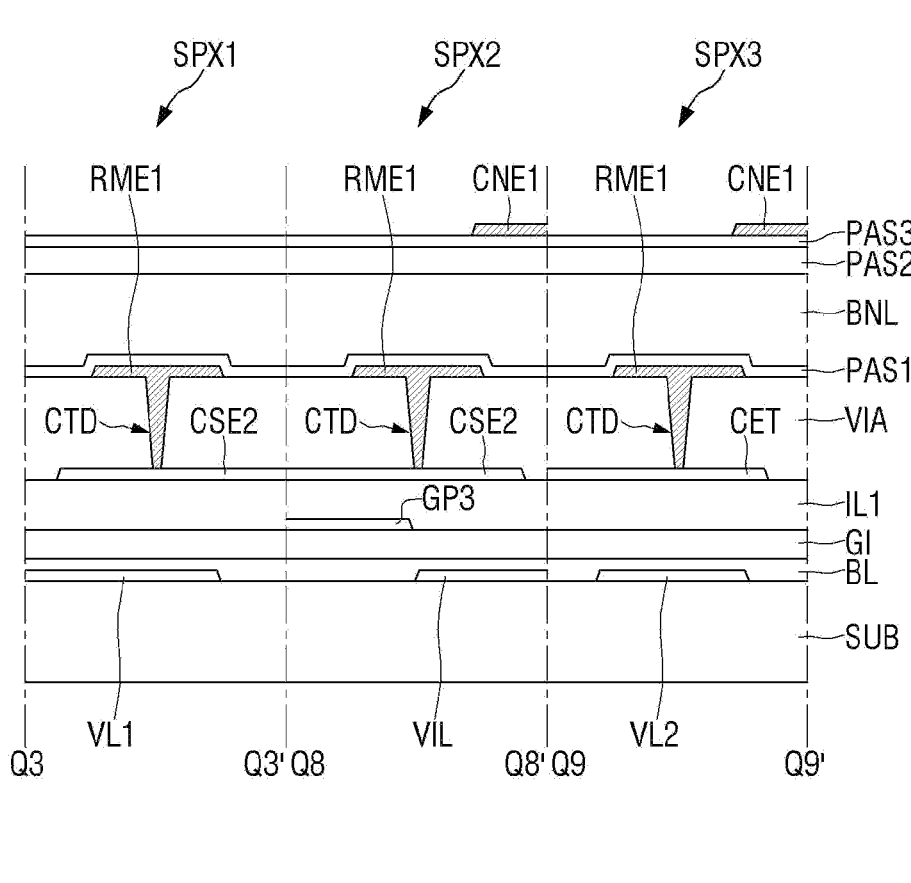
FIG. 17 is a schematic cross-sectional view taken along lines Q3-Q3', Q8-Q8' and Q9-Q9' of FIG. 5 and FIG. 12.

FIG. 11 is a schematic plan view illustrating electrodes disposed on the third conductive layer of FIG. 5. FIG. 12 is a schematic plan view illustrating electrodes and a bank, which may be included in a pixel of a display device according to an embodiment of the disclosure. FIG. 13 is a schematic cross-sectional view taken along line Q1-Q1' of FIG. 5 and FIG. 12. FIG. 14 is a schematic cross-sectional view taken along lines Q2-Q2' and Q3-Q3' of FIG. 5 and FIG. 12. FIG. 15 is a schematic cross-sectional view taken along lines Q4-Q4' and Q5-Q5' of FIG. 5 and FIG. 12. FIG. 16 is a schematic cross-sectional view taken along lines Q6-Q6' and Q7-Q7' of FIG. 5 and FIG. 12. FIG. 17 is a schematic cross-sectional view taken along lines Q3-Q3', Q8-Q8' and Q9-Q9' of FIG. 5 and FIG. 12.

FIG. 11 illustrates the arrangement of a third conductive layer and electrodes RME disposed on the third conductive layer, and FIG. 12 illustrates the arrangement of electrodes RME, a bank BNL and light emitting elements ED disposed on the lines. FIG. 13 illustrates a cross-section of a first transistor T1 connected to a first subpixel SPX1 of one pixel PX, and FIG. 14 illustrates a portion where a portion of the electrodes RME of the first subpixel SPX1 may be connected with the third conductive layer. FIG. 15 illustrates a cross-section of a second transistor T2 and a third transistor T3, which may be respectively connected to the first subpixel SPX1, and FIG. 16 illustrates a cross-section of a portion where the electrodes RME may be connected with connection electrodes CNE. FIG. 17 illustrates a portion where the first electrodes RME1 of each subpixel SPXn may be connected to a lower conductive layer.

Referring to FIGS. 11 to 17, a display element layer may be disposed on a circuit layer. The display device may further include a via layer VIA disposed between the display element layer and the circuit layer. The via layer VIA may be disposed on the third conductive layer. The via layer VIA may include an organic insulating material such as, for example, polyimide (PI), to perform a surface planarization function.

Multiple electrodes RME; RME1, RME2, RME3 and multiple protrusion patterns BP; BP1 and BP2, a bank BNL, multiple light emitting elements ED and multiple connection electrodes CNE; CNE1, CNE2 and CNE3 may be disposed on the via layer VIA as display element layers. In addition, insulating layers PAS1, PAS2 and PAS3 may be disposed on the via layer VIA.

The protrusion patterns BP may be disposed directly on the via layer VIA. The protrusion patterns BP may have a width in the first direction DR1, and may have a shape extended in the second direction DR2. The protrusion patterns BP may be disposed over light emission areas EMA of different subpixels SPXn, or may be disposed in the light emission areas EMA. For example, the protrusion patterns BP may include a first protrusion pattern BP1 disposed over the light emission areas EMA of different subpixels SPXn and a second protrusion pattern BP2 disposed between the first protrusion patterns BP1 in the light emission area EMA of each of the subpixels SPXn.

The first protrusion pattern BP1 and the second protrusion pattern BP2 may be spaced apart from each other in the first direction DR1 in the light emission area EMA. The second protrusion pattern BP2 may be disposed at the center of the light emission area EMA, and the first protrusion patterns BP1 may be spaced apart from each other with the second protrusion pattern BP2 interposed therebetween. The first protrusion pattern BP1 and the second protrusion pattern BP2 may alternately be disposed along the first direction DR1. The light emitting elements ED may be disposed between the first protrusion pattern BP1 and the second protrusion pattern BP2.

The first protrusion pattern BP1 and the second protrusion pattern BP2 may be the same as each other in length in the second direction DR2, but may be different from each other in width measured in the first direction DR1. A portion of the bank BNL, which may be extended in the second direction DR2, may overlap the first protrusion pattern BP1 in a thickness direction. The protrusion patterns BP may be disposed on a front surface of the display area DPA in an isolated pattern (e.g., island pattern).

The protrusion patterns BP may have a structure in which at least a portion may be protruded based on an upper surface of the via layer VIA. The protruded portion of the protrusion pattern BP may have an inclined or curved side. Unlike the shown example, the protrusion pattern BP may have a semi-circular or semi-elliptical shape with a curved outer surface on a cross-sectional view. The protrusion pattern BP may include, but is not limited to, an organic insulating material such as polyimide (PI).

The electrodes RME may be disposed in each subpixel in a shape extended in one direction. The electrodes RME may be extended in the second direction DR2, and may be disposed over the light emission area EMA and the subpixel SPXn and spaced apart from each other in the first direction DR1. The display device 10 may include a first electrode RME1, a second electrode RME2 and a third electrode RME3, which may be disposed in each subpixel SPXn. The first electrode RME1 may be disposed at the center of the light emission area EMA, the second electrode RME2 may be disposed on the left side of the first electrode RME1, and the third electrode RME3 may be disposed on the right side of the first electrode RME1.

The first electrode RME1 may be disposed on the second protrusion pattern BP2, and a portion of the second electrode RME2 and a portion of the third electrode RME3 may be disposed on their respective first protrusion patterns BP1 different from each other. Each of the electrodes RME may be disposed on an inclined side of at least each of the protrusion patterns BP1 and BP2. The first electrode RME1 may have a greater width in the first direction DR1 than the second protrusion pattern BP2, and the second electrode RME2 and the third electrode RME3 may have a smaller width in the first direction DR1 than the first protrusion pattern BP1. Each of the electrodes RME may be disposed to cover one side of the protrusion patterns BP, thereby reflecting light emitted from the light emitting element ED. In addition, the spacing between the electrodes RME in the first direction DR1 may be narrower than the spacing between the protrusion patterns BP1 and BP2. As at least a portion of each of the electrodes RME may be disposed directly on the via layer VIA, the electrodes RME may be disposed on a same plane.

The first electrode RME1 and the third electrode RME3 may be extended in the second direction DR2, and may be spaced apart from the first electrode RME1 and the third electrode RME3 of another subpixel SPXn adjacent thereto in the second direction DR2 in a sub-area SA of each subpixel SPXn. On the other hand, the second electrode RME2 may be extended in the second direction DR2 and disposed in the subpixels arranged in the second direction DR2.

The first electrode RME1 may be connected with the third conductive layer through a first electrode contact hole CTD formed in a portion overlapping the bank BNL. The first electrode RME1 of the first subpixel SPX1 may be in contact with the second capacitance electrode CSE2 in a portion overlapping the bank BNL positioned above the light emission area EMA through a first electrode contact hole CTD that passes through the via layer VIA. The first electrode RME1 of the second subpixel SPX2 and the third subpixel SPX3 may be connected with the third conductive layer in the portion overlapping the bank BNL positioned above the light emission area EMA through the first electrode contact hole CTD that passes through the via layer VIA. The first electrode RME1 of the second subpixel SPX2 may be connected with any one of the second capacitance electrodes CSE2, and the first electrode RME1 of the third subpixel SP3 may be connected with the electrode connection portion CET.

The second electrode RME2 may be connected with the third voltage line VL3 in the sub-area SA positioned at the lower side of the light emission area EMA through a second electrode contact hole CTS that passes through the via layer VIA. The third voltage line VL3 connected with the second electrode RME2 may be a voltage line connected with the second voltage line VL2. For example, among the pixels PX or subpixels SPXn arranged in the second direction DR2, the second electrode RME2 may be connected with the third voltage line VL3 through the second electrode contact hole CTS in the pixels PX belonging to some pixel rows, and the second electrode RME2 may not be connected with the third voltage line VL3 in the pixels PX belonging to the other pixel rows. In a pixel row in which the second electrode RME2 may not be connected with the third voltage line VL3, the third voltage line VL3 may be connected with the first voltage line VL1.

The electrodes RME may electrically be connected with a portion of the light emitting elements ED. Each of the electrodes RME may be connected with the light emitting element ED through connection electrodes CNE; CNE1, CNE2 and CNE3 that will be described later, and may transfer an electrical signal applied from a lower conductive layer to the light emitting element ED.

The first insulating layer PAS1 may be disposed on the via layer VIA, the protrusion patterns BP and the electrodes RME. The first insulating layer PAS1 may be disposed on the via layer VIA to cover the electrodes RME and the protrusion patterns BP. The first insulating layer PAS1 may not be disposed in a portion of the sub-area SA, in which the electrodes RME adjacent to each other in the second direction DR2 may be spaced apart from each other. The first insulating layer PAS1 may protect the electrodes RME and at the same time insulate different electrodes RME from each other. In addition, the first insulating layer PAS1 may prevent the light emitting element ED disposed thereon from being damaged due to direct contact with the electrode RME.

In an embodiment, the first insulating layer PAS1 may be provided with a step difference such that a portion of an upper surface may be recessed between the electrodes RME spaced apart from each other in the first direction DR1. The light emitting element ED may be disposed on the upper surface on which the step difference of the first insulating layer PAS1 may be formed, and a space may be formed between the light emitting element ED and the first insulating layer PAS1.

The first insulating layer PAS1 may include contact portions CT1, CT2 and CT3 that expose a portion of the upper surface of each of the electrodes RME. The contact portions CT1, CT2 and CT3 may pass through the first insulating layer PAS1, and the connection electrodes CNE, which will be described later, may be in contact with the electrode RME exposed through the contact portions CT1, CT2 and CT3.

The bank BNL may be disposed on the first insulating layer PAS1. The bank BNL may be disposed in a grid shaped pattern including a portion extended in the second direction DR2 and the first direction DR1 in plan view, and may partition adjacent subpixels SPXn disposed over a boundary of the respective subpixels SPXn. In addition, the bank BNL may be disposed to surround the light emission area EMA and the sub-area SA, and areas partitioned and opened by the bank BNL may be the light emission area EMA and the sub-area SA, respectively.

The bank BNL may have a height, and in some embodiments, the upper surface of the bank BNL may be higher than the protrusion patterns BP, and its thickness may be equal to or greater than the protrusion pattern BP. The bank BNL may prevent ink from overflowing to the subpixel SPXn adjacent thereto during an inkjet printing process of the manufacturing process of the display device 10. The bank BNL may prevent inks dispersed by light emitting elements ED different for each of different subpixels SPXn from being mixed with each other. The bank BNL may include, but is not limited to, polyimide in the same manner as the protrusion pattern BP.

The light emitting elements ED may be disposed on the first insulating layer PAS1. The light emitting element ED may include layers disposed to be parallel with the upper surface of the substrate SUB. The light emitting element ED of the display device 10, which may be extended in a direction, may be disposed to be parallel with the substrate SUB, and semiconductor layers included in the light emitting element ED may sequentially be disposed along a direction parallel with the upper surface of the substrate SUB, but are not limited thereto. As the case may be, when the light emitting element ED has another structure, the layers may be disposed in a direction perpendicular to the substrate SUB.

The light emitting elements ED may be disposed on the electrodes RME spaced apart from each other in the first direction DR1 between different protrusion patterns BP1 and BP2. The light emitting elements ED may be disposed to be spaced apart from each other along the second direction DR2, and may substantially be aligned to be parallel with each other. The light emitting element ED may have a shape extended in a direction, and its extended length may be longer than the shortest distance between the electrodes RME spaced apart from each other in the first direction DR1. The light emitting elements ED may be disposed such that at least one end may be disposed on any one of different electrodes RME or both ends may be disposed on different electrodes RME. The direction in which each of the electrodes RME may be extended and the direction in which the light emitting element ED may be extended may substantially be perpendicular to each other. However, without limitation to this example, the light emitting element ED may be disposed obliquely with respect to the direction in which each of the electrodes RME may be extended.

The light emitting element ED may include a first light emitting element ED1 having both ends disposed on the first electrode RME1 and the third electrode RME3 and a second light emitting element ED2 having both ends disposed on the first electrode RME1 and the second electrode RME2. The first light emitting elements ED1 may be disposed on the right side of the first electrode RME1, and the second light emitting elements ED2 may be disposed on the left side of the first electrode RME1.

The light emitting elements ED disposed in each subpixel SPXn may include semiconductor layers to emit light of a specific wavelength band. A first end portion and a second end portion opposite to the first end portion of the light emitting elements ED may be defined based on any one semiconductor layer. For example, a portion disposed on the first electrode RME1 may be the first end portion of the first light emitting element ED1, and a portion disposed on the third electrode RME3 may be the second end portion of the first light emitting element ED1. Likewise, a portion disposed on the first electrode RME1 may be the first end portion of the second light emitting element ED2, and a portion disposed on the second electrode RME2 may be the second end portion of the second light emitting element ED2. The first end portion of each of the first light emitting element ED1 and the second light emitting element ED2 may be disposed on the first electrode RME1. The direction of the first end portion in the first light emitting element ED1 may be opposite to the direction of the first end portion in the second light emitting element ED2. However, in some embodiments, the first and second light emitting elements ED1 and ED2 may be disposed such that the first end portions may be directed toward the same direction.

The light emitting elements ED may be in contact with the connection electrodes CNE; CNE1, CNE2 and CNE3 and thus electrically connected with the electrode RME and another light emitting element ED. A portion of the semiconductor layer may be exposed on an end surface in a direction in which the light emitting element ED may be extended, and the exposed semiconductor layer may be in contact with the connection electrode CNE. Each of the light emitting elements ED may electrically be connected with the conductive layers below the electrode RME and the via layer VIA through the connection electrodes CNE, and an electrical signal may be applied to each of the light emitting elements ED to emit light of a specific wavelength band.

The second insulating layer PAS2 may be disposed in the light emitting elements ED, the bank BNL and the sub-area SA. The second insulating layer PAS2 may include a pattern portion extended in the second direction DR2 and disposed on the light emitting elements ED. The pattern portion may be disposed to partially surround an outer surface of the light emitting element ED between the first protrusion pattern BP1 and the second protrusion pattern BP2, and may not cover both sides or both ends of the light emitting element ED. The pattern portion may form a linear pattern or an isolated (e.g., island-shaped) pattern within each subpixel SPXn in plan view. The pattern portion of the second insulating layer PAS2 may protect the light emitting element ED and at the same time fix the light emitting elements ED during the manufacturing process of the display device 10. In addition, the second insulating layer PAS2 may be disposed to fill a space between the light emitting element ED and the first insulating layer PAS1 below the light emitting element ED.

The multiple connection electrodes CNE; CNE1, CNE2 and CNE3 may be disposed on the electrodes RME and the light emitting elements ED, and may be in contact with them. For example, the connection electrode CNE may be in contact with any one end portion of the light emitting element ED, and may be in contact with at least one of the electrodes RME through the contact portions CT1, CT2 and CT3 that pass through the first insulating layer PAS1.

The first connection electrode CNE1 may have a shape extended in the second direction DR2, and may be disposed on the first electrode RME1. A portion of the first connection electrode CNE1, which may be disposed on the second protrusion pattern BP2, may overlap the first electrode RME1, and may be extended from the first electrode RME1 in the second direction DR2 to reach the sub-area SA positioned on the lower side of the light emission area EMA beyond the bank BNL. The first connection electrode CNE1 may be in contact with the first electrode RME1 in the sub-area SA through the first contact portion CT1 that exposes the upper surface of the first electrode RME1. The first connection electrode CNE1 may be in contact with the first end portion of the first light emitting elements ED1 and the first electrode RME1 to transfer the electrical signal applied from the first transistor T1 to the light emitting element ED.

The second connection electrode CNE2 may have a shape extended in the second direction DR2, and may be disposed on the second electrode RME2. A portion of the second connection electrode CNE2, which may be disposed on the first protrusion pattern BP1, may overlap the second electrode RME2, and may be extended from the second electrode RME2 in the second direction DR2 to reach the sub-area SA positioned on the lower side of the light emission area EMA beyond the bank BNL. The second connection electrode CNE2 may be in contact with the second electrode RME2 in the sub-area SA through the second contact portion CT2 that exposes the upper surface of the second electrode RME2. The second connection electrode CNE2 may be in contact with the second end portion of the second light emitting elements ED2 and the second electrode RME2 to transfer the electrical signal applied from the second voltage line VL2 to the light emitting element ED.

The third connection electrode CNE3 may include extension portions CN_E1 and CN_E2 extended in the second direction DR2 and a first connection portion CN_B1 connecting the extension portions CN_E1 and CN_E2. The first extension portion CN_E1 may be disposed on the third electrode RME3 and thus disposed to be extended from the light emission area EMA to the sub-area SA positioned at the upper side. The second extension portion CN_E2 may be disposed on the first electrode RME1 in the light emission area EMA, and the first connection portion CN_B1 may be extended from the light emission area EMA in the first direction DR1 to connect the first extension portion CN_E1 with the second extension portion CN_E2. The first extension portion CN_E1 of the third connection electrode CNE3 may be in contact with the third electrode RME3 in the sub-area SA through the third contact portion CT3 that exposes the upper surface of the third electrode RME3. The third connection electrode CNE3 may be in contact with the second end portion of the first light emitting elements ED1 and the first end portion of the second light emitting elements ED2 to electrically connect the first light emitting element ED1 with the second light emitting element ED2. The first light emitting element ED1 and the second light emitting element ED2 may be connected with each other in series through the third connection electrode CNE3.

The third insulating layer PAS3 may be disposed on the third connection electrode CNE3 and the second insulating layer PAS2. The third insulating layer PAS3 may entirely be disposed on the second insulating layer PAS2 to cover the third connection electrode CNE3, and the first connection electrode CNE1 and the second connection electrode CNE2 may be disposed on the third insulating layer PAS3. The third insulating layer PAS3 may be disposed entirely on the via layer VIA except for an area where the first connection electrode CNE1 and the second connection electrode CNE2 may be disposed. For example, the third insulating layer PAS3 may be disposed on the protrusion pattern BP and the bank BNL in addition to the first insulating layer PA1 and the second insulating layer PAS2. The third insulating layer PAS3 may insulate the first connection electrode CNE1 and the second connection electrode CNE2 from the third connection electrode CNE3 to allow the first connection electrode CNE1 and the second connection electrode CNE2 not to be directly in contact with the third connection electrode CNE3.

In some embodiments, the third insulating layer PAS3 may be omitted in the display device 10. Therefore, the connection electrodes CNEs may be disposed directly on the second insulating layer PAS2 and thus substantially disposed on the same layer.

Although not shown, another insulating layer may further be disposed on the third insulating layer PAS3 and the connection electrodes CNE. The insulating layer may serve to protect members disposed on the substrate SUB from external environments.

The first insulating layer PAS1, the second insulating layer PAS2 and the third insulating layer PAS3 may include an inorganic insulating material or an organic insulating material, but are not limited thereto.

Figure 18:
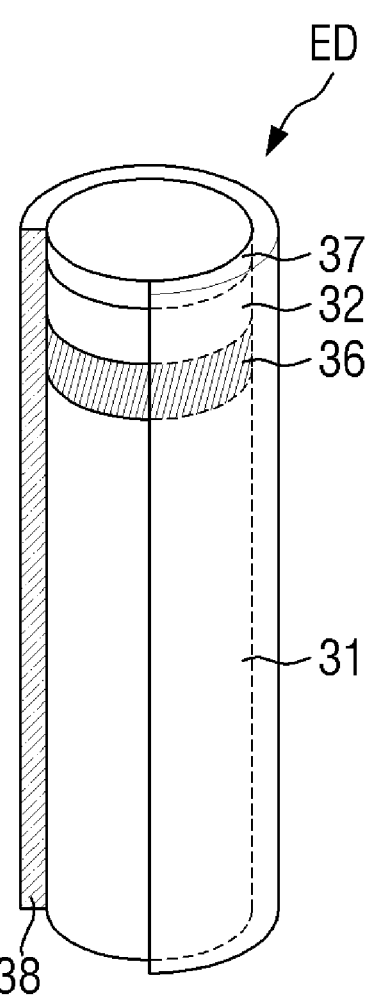
FIG. 18 is a schematic view illustrating a light emitting element according to an embodiment of the disclosure.

FIG. 18 is a schematic view illustrating a light emitting element according to an embodiment of the disclosure.

Referring to FIG. 18, the light emitting element ED may be a light emitting diode, and specifically, the light emitting element ED may be an inorganic light emitting diode having a size of a nano-meter or a micro-meter, made of an inorganic material. The light emitting element ED may be aligned between two electrodes having polarities in case that an electric field is formed in a specific direction between the two electrodes facing each other.

The light emitting element ED according to an embodiment may have a shape extended in a direction. The light emitting element ED may have a shape such as a cylinder, a rod, a wire and a tube, but the shape of the light emitting element ED is not limited thereto. The light emitting element ED may have various shapes like a polygonal pillar shape, such as a cube, a cuboid, and a hexagonal pillar, or a shape extended in a direction, having an external surface that may be partially inclined.

The light emitting element ED may include a semiconductor layer doped with any conductive type (e.g., p-type or n-type) impurities. The semiconductor layer may emit light of a specific wavelength band by an electrical signal applied from an external power source and transferred thereto. The light emitting element ED may include a first semiconductor layer 31, a second semiconductor layer 32, a light emitting layer 36, an electrode layer 37, and an insulating layer 38.

The first semiconductor layer 31 may be an n-type semiconductor. The first semiconductor layer 31 may include a semiconductor material having a chemical formula of $Al_xGa_yIn_{1-x-y}N(0\leq x\leq1, 0\leq y\leq1, 0\leq x+y\leq1)$. For example, the first semiconductor layer 31 may be any one or more of n-type doped AlGaInN, GaN, AlGaN, InGaN, AlN and InN. The n-type dopant doped on the first semiconductor layer 31 may be Si, Ge, Sn, etc., or a combination thereof.

The second semiconductor layer 32 may be disposed on the first semiconductor layer 31 with the light emitting layer 36 interposed therebetween. The second semiconductor layer 32 may be a p-type semiconductor, and may include a semiconductor material having a chemical formula of $Al_xGa_yIn_{1-x-y}N(0\leq x\leq1, 0\leq y\leq1, 0\leq x+y\leq1)$. For example, the second semiconductor layer 32 may be any one or more of p-type doped AlGaInN, GaN, AlGaN, InGaN, AlN and InN. The p-type dopant doped on the second semiconductor layer 32 may be Mg, Zn, Ca, Se, Ba, etc., or a combination thereof.

The first semiconductor layer 31 and the second semiconductor layer 32 may be formed of a single layer in the drawing, but are not limited thereto. The first semiconductor layer 31 and the second semiconductor layer 32 may further include a larger number of layers, such as a clad layer or a tensile strain barrier reducing (TSBR) layer, depending on a material of the light emitting layer 36.

The light emitting layer 36 may be disposed between the first semiconductor layer 31 and the second semiconductor layer 32. The light emitting layer 36 may include a single or multiple quantum well structure material. When the light emitting layer 36 includes a material of a multiple quantum well structure, quantum layers and well layers may alternately be deposited. The light emitting layer 36 may emit light by combination of electron-hole pairs in accordance with an electrical signal applied through the first semiconductor layer 31 and the second semiconductor layer 32. The light emitting layer 36 may include a material such as AlGaN and AlGaInN. Particularly, when the light emitting layer 36 has a deposited structure of quantum layers and well layers, which may be alternately deposited in a multiple quantum well structure, the quantum layer may include a material such as AlGaN or AlGaInN, and the well layer may include a material such as GaN or AlInN.

The light emitting layer 36 may have a deposited structure of a semiconductor material having a big band gap energy and semiconductor materials having a small band gap energy, which may be alternately deposited, and may include group III or group V semiconductor materials in accordance with a wavelength band of light that may be emitted. The light emitting layer 36 may emit light of a red or green wavelength band, as the case may be, without being limited to light of a blue wavelength band.

The electrode layer 37 may be an ohmic connection electrode, but is not limited thereto. The electrode layer 37 may be a Schottky connection electrode. The light emitting element ED may include at least one electrode layer 37. The light emitting element ED may include one or more electrode layers 37 but is not limited thereto, and the electrode layer 37 may be omitted.

The electrode layer 37 may reduce resistance between the light emitting element ED and an electrode or a connection electrode when the light emitting element ED may be electrically connected with the electrode or the connection electrode in the display device 10. The electrode layer 37 may include a metal having conductivity. For example, the electrode layer 37 may include at least one of Al, Ti, In, Au, Ag, ITO, IZO and ITZO.

The insulating layer 38 may be disposed to surround outer surfaces of the semiconductor layers and the electrode layers. For example, the insulating layer 38 may be disposed to surround an outer surface of the light emitting layer 36, and may be formed to expose both ends in a length direction of the light emitting element ED. Also, the insulating layer 38 may be formed with a rounded upper surface in an area adjacent to at least one end portion of the light emitting element ED.

The insulating layer 38 may include materials having insulation property, for example, silicon oxide (SiOx), silicon nitride (SiNx), silicon oxynitride (SiOxNy), aluminum nitride (AlNx), aluminum oxide (AlOx), etc., or a combination thereof. The insulating layer 38 may be formed of a single layer but is not limited thereto. In some embodiments, the insulating layer 38 may be formed of a multi-layered structure in which multiple layers may be deposited.

The insulating layer 38 may serve to protect the above members. The insulating layer 38 may prevent electrical short, which may occur in the light emitting layer 36 in case that the insulating layer 38 is directly in contact with an electrode of which electrical signal is transferred to the light emitting element ED, from occurring. Also, the insulating layer 38 may prevent light emission efficiency of the light emitting element ED from being deteriorated.

Also, an outer surface of the insulating layer 38 may be surface-treated. The light emitting element ED may be aligned by being jetted on the electrode in a state that it may be dispersed in an ink. The surface of the insulating layer 38 may be treated with hydrophobic or hydrophilic property, whereby the light emitting element ED may be maintained to be dispersed in the ink without being condensed with another light emitting element ED adjacent thereto.

Figure 19:
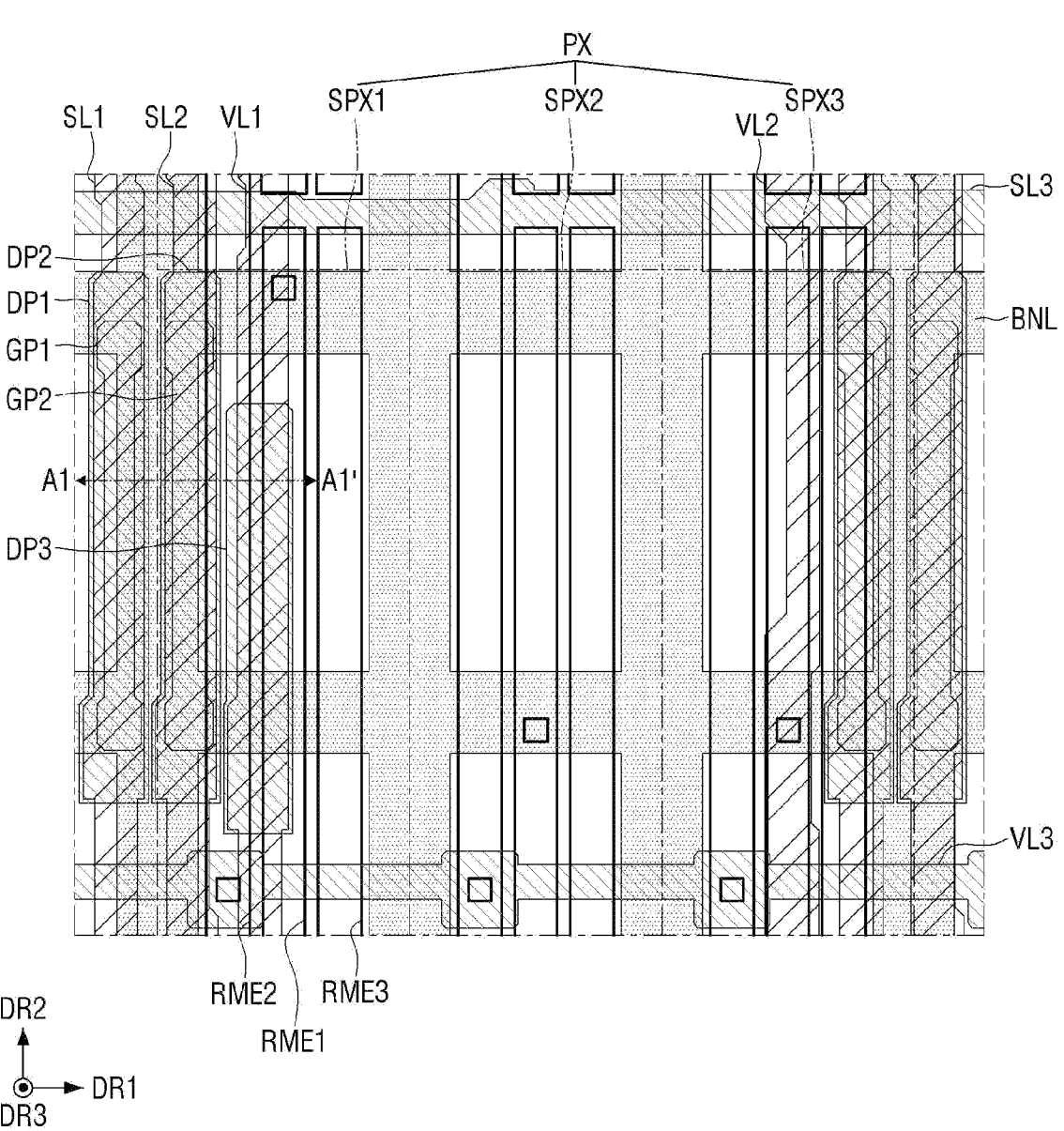
FIG. 19 is a schematic plan view illustrating a relative arrangement of electrodes and a bank and a portion of lower lines, which are disposed in a pixel of a display device according to an embodiment of the disclosure.
Figure 20:
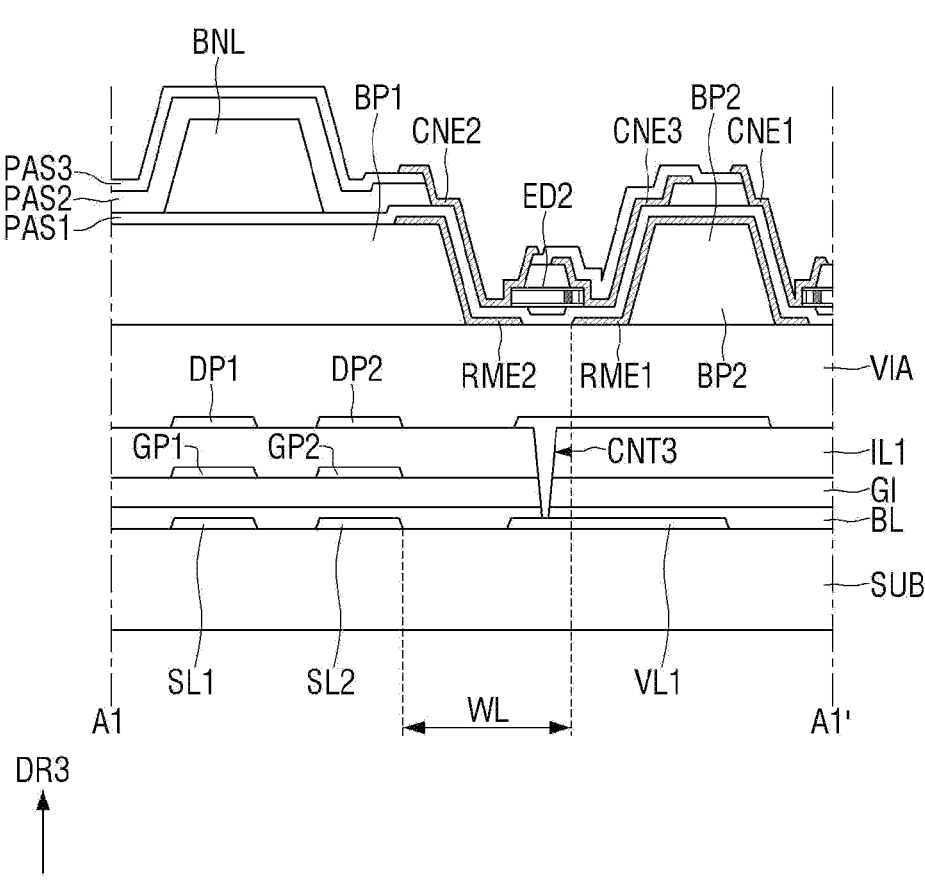
FIG. 20 is a schematic cross-sectional view taken along line A1-A1' of FIG. 19.

FIG. 19 is a schematic plan view illustrating a relative arrangement of electrodes, a bank and a portion of lower lines, which may be disposed in a pixel of a display device according to an embodiment of the disclosure. FIG. 20 is a schematic cross-sectional view taken along line A1-A1' of FIG. 19. FIG. 19 illustrates electrodes RME of respective subpixels SPXn together with scan lines SL1, SL2 and SL3 and voltage lines VL1, VL2 and VL3 as some lines of a first conductive layer, a second conductive layer and a third conductive layer. FIG. 20 illustrates a cross-section of a second light emitting element ED2, a first scan line SL1 and a second scan line SL2, which may be disposed in the first subpixel SPX1.

Referring to FIGS. 11, 19 and 20, the display device 10 may include first to third subpixels SPX1, SPX2 and SPX3 in a pixel PX, and scan lines SL1, SL2 and SL3, data lines DTL and voltage lines VL1, VL2 and VL3, which may be connected to each subpixel SPXn, may repeatedly be disposed in a unit of an area occupied by a pixel PX. As the subpixels SPXn of each pixel PX may be arranged in the first direction DR1, the lines extended in the second direction DR2 may be disposed in an area occupied by different subpixels SPXn in accordance with their positions. For example, the first scan line SL1 and the second scan line SL2 may be disposed in an area occupied by the first subpixel SPX1 or at a left side of the area, and the data lines DTL may be disposed in an area occupied by the second subpixel SPX2 and the third subpixel SPX3.

According to an embodiment of the disclosure, in the display device 10, the first scan line SL1 and the second scan line SL2 may be disposed to be adjacent to the electrodes RME of the first subpixel SPX1, and may be disposed so as not to overlap at least the first electrode RME1 in the thickness direction. The first scan line SL1 and the second scan line SL2 may be disposed so as not to completely overlap the first electrode RME1. The first scan line SL1 and the second scan line SL2 may be disposed at a boundary between the first subpixel SPX1 and the third subpixel SPX3 of another pixel PX. The first scan line SL1 and the second scan line SL2 may overlap a portion of the bank BNL, which may be extended in the second direction DR2, and the first protrusion pattern BP1 in the thickness direction. In the first scan line SL1 and the second scan line SL2, the second scan line SL2 adjacent to the first electrode RME1 may not overlap the first electrode RME1 in the thickness direction but partially overlap the second electrode RME2. In accordance with the arrangement of the first scan line SL1 and the second scan line SL2, the first and second gate patterns GP1 and GP2 of the second conductive layer and the first and second conductive patterns DP1 and DP2 of the third conductive layer may not overlap the first electrode RME1 in the thickness direction.

Signals for emitting the light emitting elements ED may be applied to the electrodes RME disposed in each subpixel SPXn, and signals for driving each of the subpixels SPXn may be applied to the lines below the electrodes RME. In case that a signal is applied to the first and second scan lines SL1 and SL2 disposed below the via layer VIA, a parasitic capacitance may be formed between different conductive layers disposed above the first and second scan lines SL1 and SL2. In the display device 10 according to an embodiment of the disclosure, the scan lines SL1 and SL2 disposed below the via layer VIA may be disposed so as not to overlap the first electrode RME1 disposed on the via layer VIA in the thickness direction, whereby a parasitic capacitance may be prevented from being formed in the first electrode RME1 by the signal applied to the scan lines SL1 and SL2. The display device 10 may minimize an influence of the signal for light emission of the light emitting element ED on the signal applied to the electrode RME by the lines below the via layer VIA.

A signal for turning on the second transistor T2 and the third transistor T3 may be applied to the first scan line SL1 and the second scan line SL2, and the signal for light emission of the light emitting element ED may be applied to the first electrode RME1. Even though a signal may be applied to the first scan line SL1 and the second scan line SL2 while the signal for light emission of the light emitting element ED is being applied to the first electrode RME1, the first electrode RME1 may be disposed so as not to overlap the scan lines SL1 and SL2 in the thickness direction, whereby the signal applied to the scan lines SL1 and SL2 may not affect the first electrode RME1.

On the other hand, the first voltage line VL1 and the third conductive pattern DP3 disposed on the right side of the second scan line SL2 may overlap the first electrode RME1 in the thickness direction. Since the first voltage line VL1 may be electrically connected with the first electrode RME1, the substantially same signal may be applied to the first voltage line VL1 and the first electrode RME1, and the first voltage line VL1 and the third conductive pattern DP3 may overlap the first electrode RME1 in the thickness direction.

In the display device 10, since multiple lines may be repeatedly disposed per area occupied by a pixel PX, types of the lines disposed below each subpixel SPXn may be different per subpixel SPXn. Even though the scan lines SL1 and SL2 may be disposed in the area occupied by the first subpixel SPX1, since the scan lines SL1 and SL2 may be disposed so as not to overlap the first electrode RME1, the signal applied to the first electrode RME1 per subpixel SPXn may not be affected by the lower line. Therefore, even though the arrangement of the lines may be different for each subpixel SPXn, intensity of light emitted from the light emitting elements ED of the subpixels SPXn may be uniform, and a spot of the pixel PX, which may be caused by a difference in the amount of light emission between the subpixels SPXn, may not be generated.

In the second subpixel SPX2, the third gate pattern GP3, the initialization voltage line VIL and a portion of the capacitance electrodes CSE1 and CSE2 may be disposed below the electrodes RME. In the third subpixel SP3, the data lines DTL and second voltage lines VL2 may be disposed below the electrodes RME. The first electrode RME1 of the third subpixel SPX3 may overlap the third data line DT3 in the thickness direction.

As described above, the first scan line SL1 and the second scan line SL2 may be connected with at least one third scan line SL3. Therefore, the pixels PX may be divided into different pixels PX in accordance with an arrangement of a ninth contact hole CNT9 through which the first and second scan lines SL1 and SL2 may be connected with the third scan line SL3. Whether an rth contact hole CNTr may be formed may affect formation of a parasitic capacitance between the first and second scan lines SL1, SL2 of the corresponding pixel PX and the first electrode RME1 of the first subpixel SPX1. For example, the pixel PX of the display device 10 may be designed to have a structure, in which the first electrode RME1 of the first subpixel SPX1 may be disposed so as not to selectively overlap the first and second scan lines SL1 and SL2 therebelow unlike the second subpixel SPX2 and the third subpixel SPX3, by a connection relation among the scan lines SL1, SL2 and SL3.

Hereinafter, even more embodiments will be described. In the following embodiments, the description of the same elements as those of the previously described embodiments will be omitted or simplified, and the following description will be based on the difference from the previous embodiments.

Figure 21:
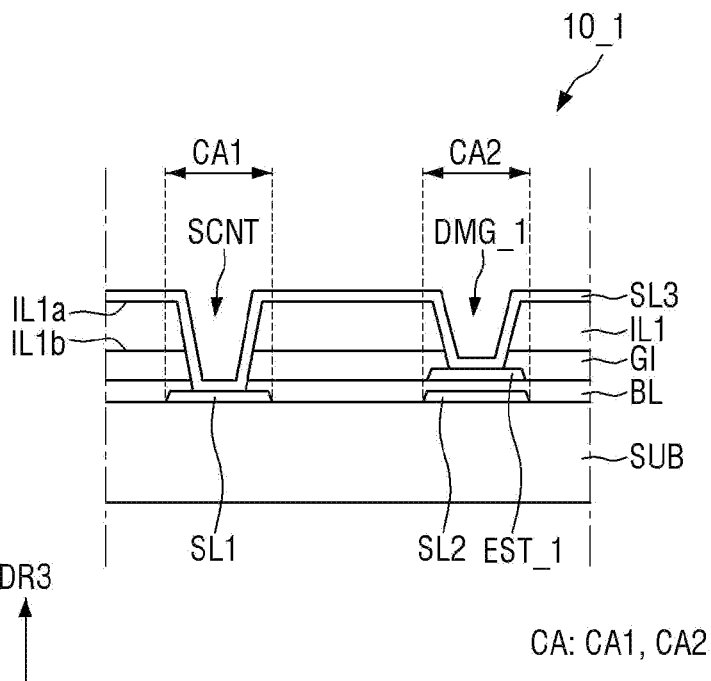
FIG. 21 is a schematic cross-sectional view illustrating a display device according to another embodiment of the disclosure.

FIG. 21 is a schematic cross-sectional view illustrating a display device according to another embodiment of the disclosure.

Referring to FIG. 21, a display device 10_1 according to an embodiment may be different from an embodiment of FIG. 10 in that the display device 10_1 may further include an etch stop pattern EST_1 disposed in the second overlap area CA2.

In more detail, the etch stop pattern EST_1 may be disposed between the third conductive layer and the first conductive layer. The etch stop pattern EST_1 may be disposed between the third scan line SL3 and the first scan line SL1 and/or between the third scan line SL3 and the second scan line SL2 in the second overlap area CA2. The etch stop pattern EST_1 may be made of a semiconductor layer, and may be disposed on the same layer as the semiconductor layer. In other words, when the semiconductor layer includes an oxide semiconductor, the etch stop pattern EST_1 may include an oxide semiconductor. In case that the semiconductor layer (or active layers ACT1, ACT2 and ACT3, see FIGS. 6 and 8) is disposed on the buffer layer BL, the etch stop pattern EST_1 may be disposed on the buffer layer BL. In this case, the etch stop pattern EST_1 may be disposed between the buffer layer BL and the first gate insulating layer GL. The etch stop pattern EST_1 may include an isolated shape (e.g., island shape) in plan view. The etch stop pattern EST_1 may be separated from the semiconductor layer. The etch stop pattern EST_1 may electrically be insulated from the semiconductor layer.

A recess pattern DMG 1 disposed in the second overlap area CA2 may pass through the first interlayer insulating layer IL1 and the first gate insulating layer GI in the thickness direction (third direction DR3) to expose the etch stop pattern EST_1. In this case, the third scan line SL3 may directly be in contact with the etch stop pattern EST_1. The etch stop pattern EST_1 may be a dummy pattern separated from the other lines other than the third scan line SL3, the electrode and the active layer and electrically insulated from them, but is not limited thereto. The recess pattern DMG 1 may not expose the etch stop pattern EST_1.

Even in this case, as the recess pattern DMG 1 may be provided, pattern recognition defects that may be detected during an auto optical inspection (AOI) may be suppressed or avoided. Also, as the etch stop pattern EST_1 may further be disposed in the second overlap area CA2, the first scan line SL1 or the second scan line SL2 of the second overlap area CA2 may be suppressed or prevented from being exposed by the recess pattern DMG 1 during the process of forming the recess pattern DMG 1. Therefore, the third scan line SL3 may be more actively and electrically insulated from the first scan line SL1 or the second scan line SL2 in the second overlap area CA2.

Figure 22:
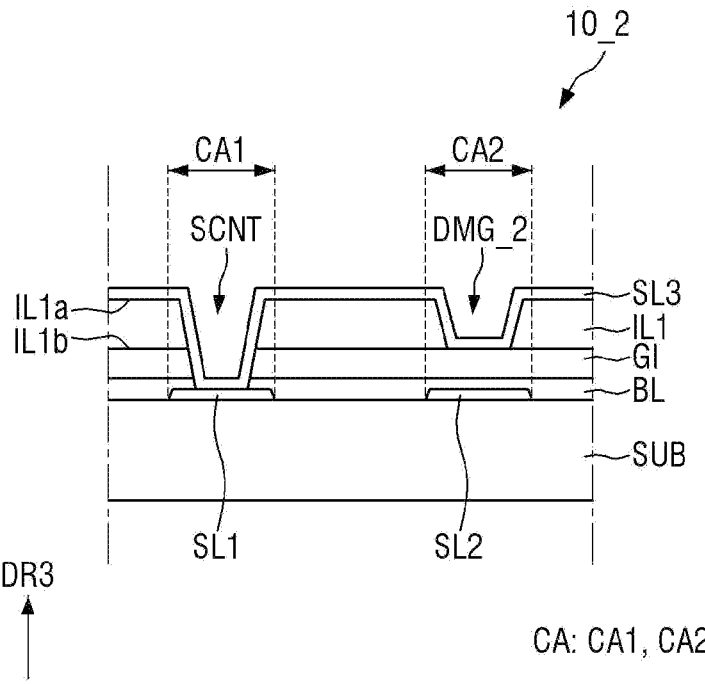
FIG. 22 is a schematic cross-sectional view illustrating a display device according to still another embodiment of the disclosure.

FIG. 22 is a schematic cross-sectional view illustrating a display device according to still another embodiment of the disclosure.

Referring to FIG. 22, an embodiment may be different from an embodiment of FIG. 10 in that a recess pattern DMG 2 of a display device 10_2 may include a shape of a through hole passing through the first interlayer insulating layer IL1 in the thickness direction (third direction DR3). In this case, the recess pattern DMG 2 includes a through hole defined by the first interlayer insulating layer ILL and the first gate insulating layer GI may be exposed by the through hole.

Even in this case, as the recess pattern DMG 2 may be provided, pattern recognition defects that may be detected during an auto optical inspection (AOI) may be suppressed or avoided. In addition, since the recess pattern DMG 2 may include various shapes, the shape of the recess pattern DMG 2 may be adjusted as needed.

Figure 23:
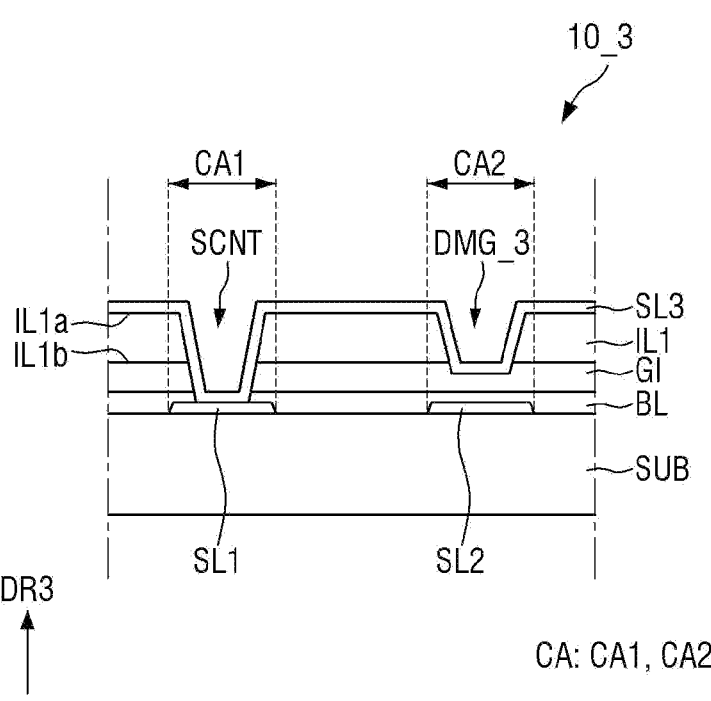
FIG. 23 is a schematic cross-sectional view illustrating a display device according to further still another embodiment of the disclosure.

FIG. 23 is a schematic cross-sectional view illustrating a display device according to further still another embodiment of the disclosure.

Referring to FIG. 23, an embodiment may be different from an embodiment of FIG. 10 in that a recess pattern DMG 3 of a display device 10_3 may be defined by the first interlayer insulating layer IL1 and the first gate insulating layer GI. The recess pattern DMG 3 may include a through hole defined by the first interlayer insulating layer IL1 and a groove defined by the first gate insulating layer GI, wherein the through hole and the groove overlap each other. The groove defined by the first gate insulating layer GI may include a shape recessed from an upper surface to a lower surface of the first gate insulating layer GI.

Even in this case, as the recess pattern DMG 3 may be provided, pattern recognition defects that may be detected during an auto optical inspection (AOI) may be suppressed or avoided. In addition, since the recess pattern DMG 3 may include various shapes, the shape of the recess pattern DMG 3 may be adjusted as needed.

Embodiments have been disclosed herein, and although terms are employed, they are used and are to be interpreted in a generic and descriptive sense only and not for purpose of limitation. In some instances, as would be apparent by one of ordinary skill in the art, features, characteristics, and/or elements described in connection with an embodiment may be used singly or in combination with features, characteristics, and/or elements described in connection with other embodiments unless otherwise specifically indicated. Accordingly, it will be understood by those of ordinary skill in the art that various changes in form and details may be made without departing from the spirit and scope of the disclosure as set forth in the following claims including equivalents thereof.

What is claimed is:

1. A display device comprising:
a first scan line extending in a first direction;
a second scan line separated from the first scan line and extending in the first direction;
a third scan line extending in a second direction intersecting the first direction, the third scan line intersecting the first scan line and the second scan line;
an etch stop pattern overlapping the second scan line and the third scan line in a thickness direction; and
an insulating layer including:
a buffer layer;
an interlayer insulating layer, the buffer layer and the interlayer insulating layer being sequentially deposited;
a scan contact hole disposed between the first scan line and the third scan line; and
a recess pattern disposed between the second scan line and the third scan line, wherein
the scan contact hole passes through the insulating layer in a thickness direction,
the first scan line and the third scan line are in electrical contact with each other by the scan contact hole,
the recess pattern includes a shape recessed from an upper surface to a lower surface of the insulating layer in the thickness direction,
the second scan line and the third scan line are electrically insulated from each other, and
the etch stop pattern is disposed between the buffer layer and the interlayer insulating layer.

2. The display device of claim 1, wherein
the recess pattern exposes the etch stop pattern, and
the third scan line extends to the etch stop pattern.

3. The display device of claim 2, wherein the etch stop pattern includes an isolated shape.

4. The display device of claim 1, wherein the etch stop pattern includes an oxide semiconductor.

5. The display device of claim 1, wherein
the third scan line is disposed in the recess pattern, and
the insulating layer is at least partially disposed between
the third scan line disposed in the recess pattern and the
second scan line in the thickness direction.

6. The display device of claim 1, further comprising:
a display area for displaying an image, wherein the scan
contact hole and the recess pattern are disposed in the
display area.

7. The display device of claim 1, further comprising:
a via layer disposed on the third scan line;
a first electrode disposed on the via layer;
a second electrode disposed on the via layer and separated
from the first electrode; and
a light emitting element disposed on the first electrode and
the second electrode.

8. The display device of claim 7, wherein the light
emitting element includes an inorganic material.

9. A display device comprising:
a first conductive layer disposed on a substrate, the first
conductive layer including a first scan line and a second
scan line;
a buffer layer disposed on the first conductive layer;
a semiconductor layer disposed on the buffer layer, the
semiconductor layer including an active layer of a thin
film transistor;
a gate insulating layer disposed on the semiconductor
layer;
a gate electrode of the thin film transistor, which is
disposed on the gate insulating layer;
an interlayer insulating layer disposed on the gate elec-
trode;
a third scan line disposed on the interlayer insulating
layer, the third scan line overlapping the first scan line
and the second scan line;
a scan contact hole disposed in a first overlap area where
the first scan line and the third scan line overlap each
other, the scan contact hole passing through the buffer
layer, the gate insulating layer and the interlayer insu-
lating layer in a thickness direction; and
a recess pattern disposed in a second overlap area where
the second scan line and the third scan line overlap each
other, the recess pattern defined by at least one of the
buffer layer, the gate insulating layer and the interlayer
insulating layer, and including a shape recessed from an
upper surface to a lower surface of the interlayer
insulating layer.

10. The display device of claim 9, further comprising:
an etch stop pattern disposed between the buffer layer and
the gate insulating layer, the etch stop pattern overlap-
ping the second scan line and the third scan line.

11. The display device of claim 10, wherein the etch stop
pattern and the active layer include a same material.

12. The display device of claim 11, wherein the etch stop
pattern is separated from the active layer, and includes an
isolated shape.

13. The display device of claim 10, wherein
the recess pattern exposes the etch stop pattern, and
the third scan line extends to the etch stop pattern.

14. The display device of claim 9, wherein
the first scan line and the second scan line extend in a first
direction, and
the third scan line extends in a second direction intersect-
ing the first direction.

15. The display device of claim 9, further comprising:
a via layer disposed on the third scan line;
a first electrode disposed on the via layer;
a second electrode disposed on the via layer and separated
from the first electrode; and
a light emitting element disposed on the first electrode and
the second electrode.

16. The display device of claim 15, wherein the light
emitting element includes an inorganic material.

17. A display device comprising:
a plurality of first scan lines extending in a first direction;
a second scan line extending in a second direction inter-
secting the first direction and overlapping the plurality
of first scan lines;
first overlap areas where a subset of the plurality of first
scan lines overlap the second scan line, the subset of the
plurality of first scan lines being electrically connected
with the second scan line in the first overlap areas;
second overlap areas where another subset of the plurality
of first scan lines overlap the second scan line, the
another subset of the plurality of first scan lines being
electrically insulated from the second scan line in the
second overlap areas; and
an insulating layer disposed between the plurality of first
scan lines and the second scan line, defining recess
patterns having a shape recessed from an upper surface
to a lower surface in the second overlap areas,
wherein a number of the recess patterns is greater than a
number of scan contact holes.

18. The display device of claim 17, further comprising:
scan contact holes disposed in the first overlap areas, the
scan contact holes passing through the insulating layer
in a thickness direction,
wherein at least one of the first scan lines and the second
scan line are in electrical contact with each other in the
first overlap areas through the scan contact holes.

* * * * *